US012777628B2

(12) United States Patent
Lin et al.

(10) Patent No.: US 12,777,628 B2
(45) Date of Patent: Oct. 27, 2026

(54) MEMORY DEVICE WITH IMPROVED MARGIN AND PERFORMANCE AND METHODS OF FORMATION THEREOF

(71) Applicant: Taiwan Semiconductor Manufacturing Co., Ltd., Hsin-Chu (TW)

(72) Inventors: Shih-Hao Lin, Hsinchu (TW); Kian-Long Lim, Hsinchu City (TW); Chih-Chuan Yang, Hsinchu (TW); Chia-Hao Pao, Hsinchu (TW); Jing-Yi Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 389 days.

(21) Appl. No.: 18/608,199

(22) Filed: Mar. 18, 2024

(65) Prior Publication Data

US 2024/0260249 A1 Aug. 1, 2024

Related U.S. Application Data

(63) Continuation of application No. 17/750,649, filed on May 23, 2022, now Pat. No. 11,937,416, which is a (Continued)

(51) Int. Cl.
*H01L 21/02* (2006.01)
*H01L 21/3065* (2006.01)
(Continued)

(52) U.S. Cl.
CPC ......... *H10B 10/125* (2023.02); *H10D 30/031* (2025.01); *H10D 30/6713* (2025.01);
(Continued)

(58) Field of Classification Search
CPC ............ H10B 10/125; H01L 21/02532; H01L 21/02603; H01L 21/3065; H01L 21/308;
(Continued)

(56) References Cited

U.S. PATENT DOCUMENTS

| | | | | |
|---|---|---|---|---|
| 11,342,338 | B2 | 5/2022 | Lin et al. | |
| 11,937,416 | B2 * | 3/2024 | Lin ...................... | H10B 10/125 |

(Continued)

*Primary Examiner* — Tong-Ho Kim
(74) *Attorney, Agent, or Firm* — HAYNES AND BOONE, LLP

(57) ABSTRACT

A substrate includes a first doped region having a first type dopant, and a second doped region having a second type dopant and adjacent to the first doped region. A stack is formed that includes first layers and second layers alternating with each other. The first and second layers each have a first and second semiconductor material, respectively. The second semiconductor material is different than the first semiconductor material. A mask element is formed that has an opening in a channel region over the second doped region. A top portion of the stack not covered by the mask element is recessed. The stack is then processed to form a first and a second transistors. The first transistor has a first number of first layers. The second transistor has a second number of first layers. The first number is greater than the second number.

20 Claims, 15 Drawing Sheets

Related U.S. Application Data continuation of application No. 17/009,034, filed on Sep. 1, 2020, now Pat. No. 11,342,338.

(60) Provisional application No. 62/906,600, filed on Sep. 26, 2019.

(51) Int. Cl.

| | |
|---|---|
| ***H01L 21/308*** | (2006.01) |
| ***H01L 21/8238*** | (2006.01) |
| ***H01L 29/06*** | (2006.01) |
| ***H01L 29/423*** | (2006.01) |
| ***H01L 29/66*** | (2006.01) |
| ***H01L 29/786*** | (2006.01) |
| ***H10B 10/00*** | (2023.01) |
| ***H10D 30/01*** | (2025.01) |
| ***H10D 30/67*** | (2025.01) |
| ***H10D 62/00*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10P 14/20*** | (2026.01) |
| ***H10P 50/00*** | (2026.01) |
| ***H10P 50/24*** | (2026.01) |

(52) U.S. Cl.

CPC ..... *H10D 30/6735* (2025.01); *H10D 30/6757* (2025.01); *H10D 62/021* (2025.01); *H10D 62/121* (2025.01); *H10D 64/017* (2025.01); *H10D 84/0167* (2025.01); *H10D 84/017* (2025.01); *H10D 84/038* (2025.01); *H10P 14/3411* (2026.01); *H10P 14/3462* (2026.01); *H10P 50/242* (2026.01); *H10P 50/691* (2026.01)

(58) Field of Classification Search

CPC ..... H01L 21/823807; H01L 21/823814; H01L 29/0673; H01L 29/42392; H01L 29/66545; H01L 29/66636; H01L 29/66742; H01L 29/78618; H01L 29/78696; H01L 29/0847; H01L 29/0653; H01L 27/092; H01L 29/66439; H01L 29/775; H01L 29/165; H01L 29/7848; B82Y 10/00

USPC .......................................................... 257/351

See application file for complete search history.

(56) References Cited

U.S. PATENT DOCUMENTS

| | | | |
|---|---|---|---|
| 2010/0264496 | A1 | 10/2010 | Thomas et al. |
| 2017/0162583 | A1 | 6/2017 | Lee et al. |

* cited by examiner

MEMORY DEVICE WITH IMPROVED MARGIN AND PERFORMANCE AND METHODS OF FORMATION THEREOF

CROSS-REFERENCE TO RELATED APPLICATIONS

This application is a continuation application of U.S. patent application Ser. No. 17/750,649, filed on May 23, 2022, which is a continuation application of U.S. patent application Ser. No. 17/009,034, filed on Sep. 1, 2020, now U.S. Pat. No. 11,342,338, which is a non-provisional application of and claims priority to U.S. Provisional Patent Application Ser. No. 62/906,600, filed on Sep. 26, 2019, the entire disclosures of which are incorporated herein by reference.

BACKGROUND

Static random access memory (SRAM) generally refers to any memory or storage that can retain stored data only when power is applied. SRAM chips may be used for a variety of different applications requiring different performance characteristics. As integrated circuit (IC) technologies progress towards smaller technology nodes, gate-all-around (GAA) transistors have been incorporated into SRAMs to reduce chip footprint while maintaining reasonable processing margins. However, SRAM chips that include GAA transistors often suffer from reduced read and/or write margins. Accordingly, although existing SRAM technologies have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
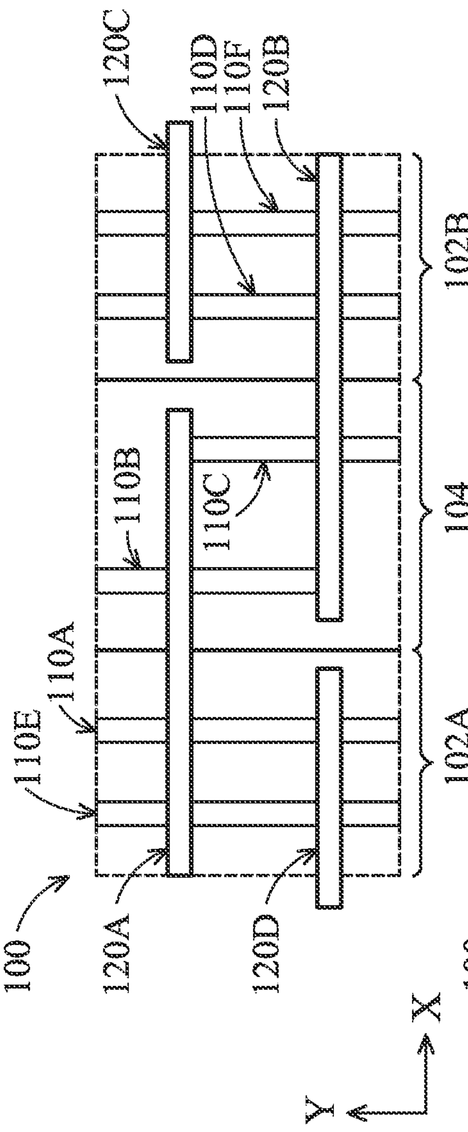
FIGS. 1A-1B are fragmentary cross-sectional views of a single-port SRAM cell in portion or entirety, according to various aspects of the present disclosure.

The present disclosure relates generally to integrated circuit (IC) devices, and more particularly, to Gate-All-Around (GAA) based SRAM devices with non-symmetrical channel layer configurations.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, “lower,” “upper,” “horizontal,” “vertical,” “above,” “over,” “below,” “beneath,” “up,” “down,” “top,” “bottom,” etc. as well as derivatives thereof (e.g., “horizontally,” “downwardly,” “upwardly,” etc.) are used for ease of the present disclosure of one features relationship to another feature. The spatially relative terms are intended to cover different orientations of the device including the features.

Memory chips, such as memory chips based on static random access memory (SRAM) cells, are crucial components for advanced IC technology nodes. SRAM cells include n-type transistors and p-type transistors, each configured to provide different functions. For example, SRAM cells are involved in reading and writing operations. Oftentimes, the speeds of the reading and writing operations are largely determined by the n-type transistors of the SRAM cells; while the p-type transistors serve to maintain the stability of the SRAM cells (such as to maintain the voltage to the data node). In such configurations, a large current in n-type transistors is usually beneficial, as it allows increased speed for read and/or write operations. However, it has been discovered that a current level in p-type transistors that is too high (such as the current level needed to optimize performance of the n-type transistors) tends to lead to deteriorated writing performances. In other words, optimal SRAM performances require a balance between current levels in the n-type transistors and current levels in the p-type transistors. Particularly, reducing current levels in p-type transistors relative to current levels in n-type transistors may be desirable.

The current levels in different types of transistors are often adjusted by tuning the size (or volume) of the respective epitaxial source features and/or epitaxial drain features (collectively referred to as epitaxial source/drain features). For example, to overcome the aforementioned problem, an SRAM cell may be configured to include an n-type transistor adjacent to a p-type transistor, where a size (for example, volume) of epitaxial source/drain features of the p-type transistor is smaller than a size of the epitaxial source/drain features of the n-type transistor. A smaller source/drain feature delivers fewer charge carriers, thereby reducing a current level of its corresponding transistor. Moreover, because proper spacing between adjacent epitaxial source/drain features is essential to avoid current leakage, such as forward biased leakage and/or well isolation leakage, the smaller epitaxial source/drain feature also allows for better isolation and larger processing margins. These concepts apply to both fin field-effect transistors (FinFETs), as well as GAA transistors (also referred to as multibridge-channel transistors). However, certain GAA transistors, such as those with sheet-shaped channel layers suffer more severe leakage challenges because of their unique configuration requiring larger spaces on the semiconductor substrate. Accordingly, reducing the epitaxial source/drain feature sizes for sheet-based GAA transistors can be especially beneficial.

One way to reduce the size of a first epitaxial source/drain feature relative to a second epitaxial source/drain feature is by selectively reducing lateral width of a base fin from which the first epitaxial source/drain feature grows relative to a lateral width of a base fin from which the second epitaxial source/drain feature grows. However, this approach inherently requires the base fins to have different lateral widths. In other words, not all base fins (or the associated fin structures) can reach desired fin dimensions at the lower technology node limit. This impedes the effort of aggressively scaling-down and the ultimate goal of achieving maximized cell performances. Thus, embodiments of this disclosure propose a new method for reducing the size of epitaxial source/drain features (and, thereby, the current level) in a first type (e.g., p-type) of GAA transistors relative to a second type (e.g., n-type) of GAA transistors without (or, in some embodiments, addition to) reducing the lateral widths of base fins of the first type of GAA transistors. Accordingly, all fin structures (and base fins) may have the lateral widths desired at the lower technology node limit, yet maintain different sized epitaxial source/drain features as needed based on their respective conductivity types.

For example, as described herein, an SRAM device may be configured to have p-type GAA transistors and n-type GAA transistors with different numbers of channel layers. Particularly, the p-type GAA transistors may have a reduced number of channel layers as compared to that of the n-type GAA transistors. Because channel layers serve as conduits for charge carriers between the source/drain features of the transistor during operation, fewer channel layers will result in reduced magnitude of total current in the p-type GAA transistors. Additionally, it has been found that the fewer channel layers in the p-type GAA transistors also benefits maintaining smaller epitaxial source/drain features for the p-type GAA transistors relative to the n-type GAA transistors. This further contributes to the reduced current level in the p-type GAA transistors and improves current balance and overall read and/or write margins of the SRAM memory cell. This approach thus enables improved design of memory chips without sacrificing overall performances. While this method applies to any variations of memory chips with GAA transistors, those memory chips with sheet-based GAA transistors receive the additional benefit of leakage reduction due to the increased spacing between adjacent epitaxial source/drain features afforded by embodiments of the present disclosure.

The present disclosure includes multiple embodiments. Different embodiments may have different advantages, and no particular advantage is necessarily required of any embodiment. Further, while the disclosure below focuses on SRAM memory cells, the disclosure further contemplates other types of memory cells. For example, this includes a dynamic random access memory (DRAM), a non-volatile random access memory (NVRAM), a flash memory, or other suitable memory. Memory cells described here may be included in a microprocessor, a memory, and/or other IC device. In some implementations, the described memory cells may be a portion of an IC chip, an SoC, or portion thereof, that includes various passive and active microelectronic devices such as resistors, capacitors, inductors, diodes, MOSFETs, CMOS transistors, BJTs, LDMOS transistors, high voltage transistors, high frequency transistors, other suitable components, or combinations thereof.

FIG. 1A is a plan view of an exemplary single-port SRAM cell 100, for example, in the x-y plane (a plane defined by the x-direction and the y-direction). It is understood that the x-direction and the y-direction are horizontal directions that are perpendicular to each other, and that the z-direction is a vertical direction that is orthogonal (or normal) to a horizontal x-y plane. FIG. 1A has been simplified for the sake of clarity to better understand the inventive concepts of the present disclosure. Additional features can be added in single-port SRAM cell 100, and some of the features described below can be replaced, modified, or eliminated in other embodiments of single-port SRAM cell 100.

Single-port SRAM cell 100 includes a substrate 101. The substrate 101 may have a top surface aligned substantially parallel to the x-y plane, and may include p-type doped regions (p-wells) 102A and 102B (collectively, p-type doped regions 102), and an n-type doped region (n-wells) 104 disposed between the p-type doped regions 102A and 102B. A variety of features are formed in the doped regions. For example, SRAM cell 100 includes fin structures 110A-110F, where the fin structures 110A, 110E, and 110D, 110F are formed in p-type doped regions 102A and 102B, respectively, and the fin structures 110B and 110C are formed in n-type doped region 104. The fin structures 110A-110F each extend along the y-direction and are separated from one another along the x-direction. Additionally, gate structures 120A-120D are formed across the n-type and the p-type doped regions over the fin structures 110A-110F, along the x-direction. Six transistors are formed from the fin structures

110A-110F and gate structures 120A-120D. These six transistors include a pass-gate transistor PG-1 formed from fin structure 110A and gate structure 120A, a pass-gate transistor PG-2 formed from fin structure 110D and gate structure 120B, a pull-up transistor PU-1 formed from fin structure 110B and gate structure 120A, a pull-up transistor PU-2 formed from fin structure 110C and gate structure 120B, a pull-down transistor PD-1 formed from fin structure 110A and gate structure 120D, and a pull-down transistor PD-2 formed from fin structure 110D and gate structure 120C. Therefore, single-port SRAM cell 100 is alternatively referred to as a 6T SRAM cell. In the depicted configuration, pull-up transistors PU-1, PU-2 are configured as p-type transistors, disposed in n-type doped region 104, and pull-down transistors PD-1, PD-2, as well as pass-gate transistors PG-1, PG-2, are configured as n-type transistors, and are disposed in p-type doped regions 102A and 102B respectively. The SRAM cell 100 may be formed adjacent to other SRAM cells, for example, another SRAM cell having the same configuration as the SRAM cell 100. In some embodiments, the SRAM cell 100 may share features with the adjacent SRAM cells. For example, the SRAM cell 100 may share fin structure 110B with an SRAM cell (not shown) disposed immediately above it along the y-direction with which the SRAM cell 100 shares a cell boundary along the x-direction. In another example, the SRAM cell 100 may share gate structure 120C with an SRAM cell (not shown) disposed to the immediate right of the SRAM cell 100 along the x-direction with which the SRAM cell 100 shares a cell boundary along the y-direction.

Figure 1B:
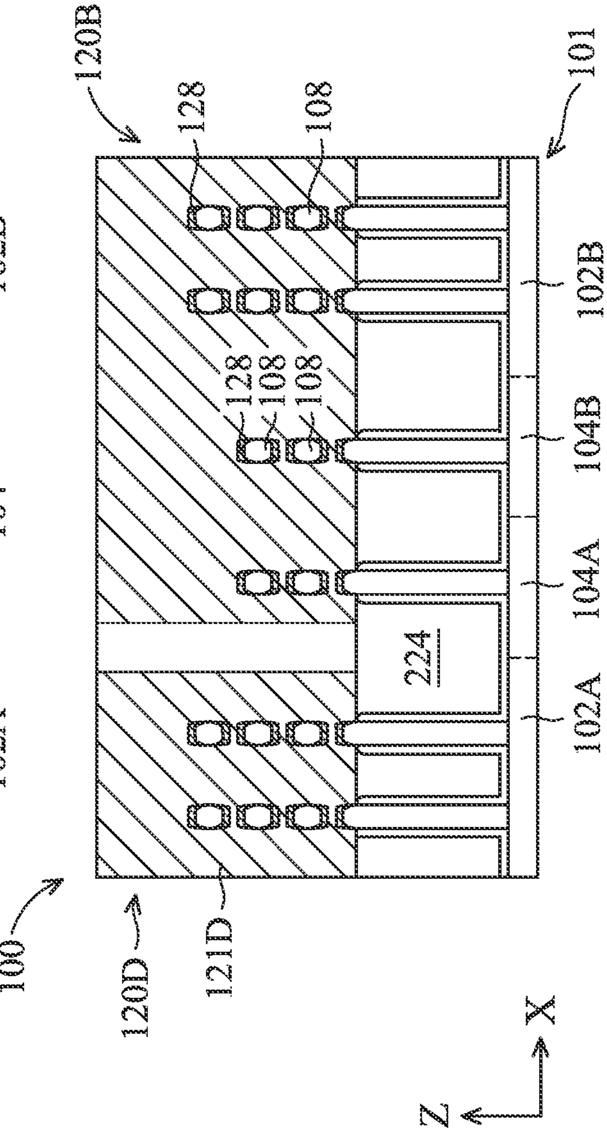

In some embodiments as illustrated in FIG. 1B, the fin structures 110A-110F each include suspended channel layers 108. Each of the channel layers 108 may have similar dimensions along the x-direction and along the z-direction. Accordingly, the channel layers 108 resemble a shape of a wire extending lengthwise along the y-direction. While the channel layers 108 are depicted in FIG. 1B as having cross sections of squares with rounded corners, it is understood that the channel layers 108 may have cross sections of any appropriate shapes, such as squares, circles, ellipsoids, rectangles, triangles, etc.

Figure 1C:
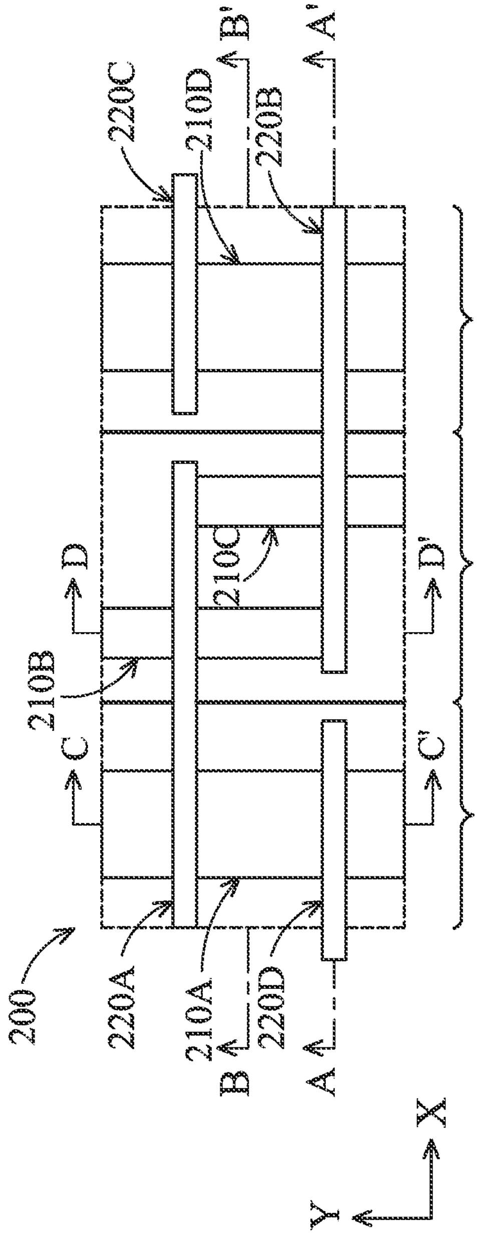
FIGS. 1C-1D are fragmentary cross-sectional views of a single-port SRAM cell in portion or entirety, according to various aspects of the present disclosure.
Figure 1D:
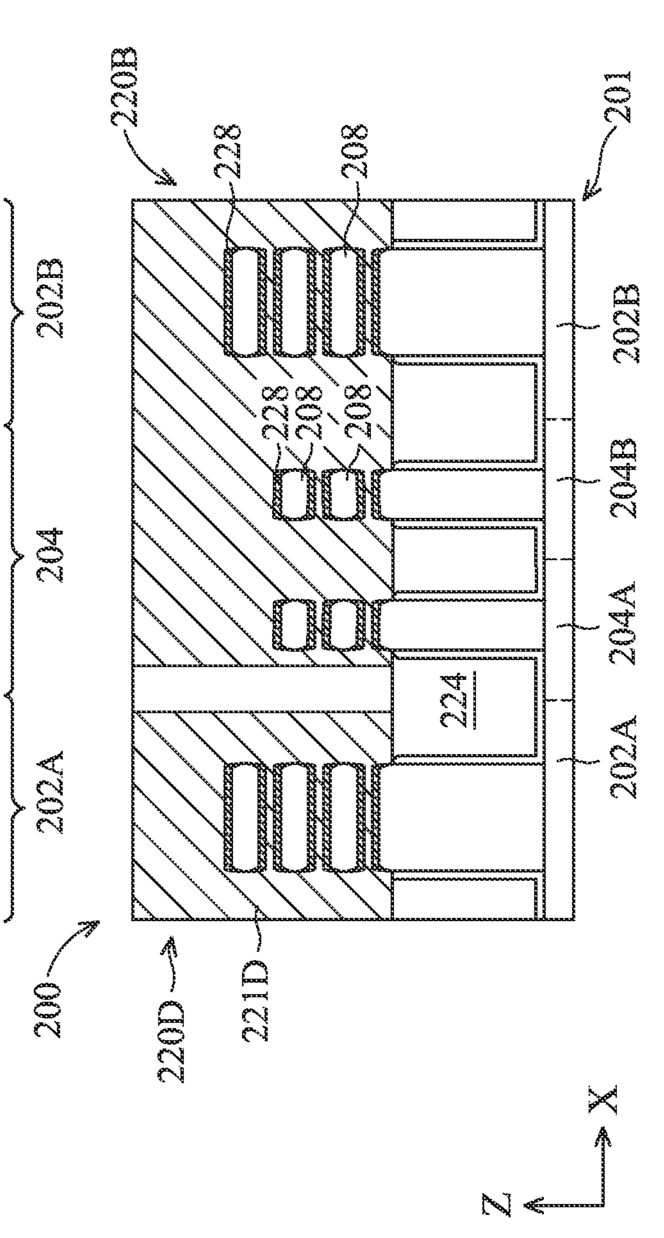

FIGS. 1C and 1D illustrate an exemplary single port SRAM cell 200. The SRAM cell 200 is similar to the SRAM cell 100 as described above with respect to FIGS. 1A and 1B. For example, the SRAM cell 200 includes p-type doped regions 202A and 202B (collectively, p-type doped region 202), as well as n-type doped region 204 (similar to p-type doped region 102A and 102B, and n-type doped region 104 of SRAM cell 100, respectively). SRAM cell 200 further includes fin structures 210A-210D (similar to fin structures 110A-110D) and gate structures 220A-220D (similar to gate structures 120A-120D) formed over the n-type and p-type doped regions to form transistors PG-1, PG-2, PD-1, PD-2, PU-1, and PU-2. However, SRAM cell 200 includes fewer fin structures in certain doped regions, such as p-type doped regions 202, than SRAM cell 100. Further, unlike SRAM cell 100, the fin structures 210A-210D each include suspended channel layers 208 that have greater lateral widths than fin structures 110A-110D. As illustrated in FIG. 1D, the channel layers 208 may have dimensions that are substantially greater along the x-direction than along the z-direction. Accordingly, the channel layers 208 resemble a sheet shape substantially parallel to an x-y plane. While the channel layers 208 in FIG. 1D are depicted as rectangles with rounded corners, it is understood that the channel layers 208 may have cross sections of any appropriate shape, such as rectangles, ellipsoids, ovals, etc. Further, channel layers 208 (and the respective fin structures) in the n-type doped regions 204 may have lateral widths along the x-direction less than that in the p-type doped regions 202. Any suitable method may be used to form SRAM cell 100 and/or SRAM cell 200.

Figure 5B:
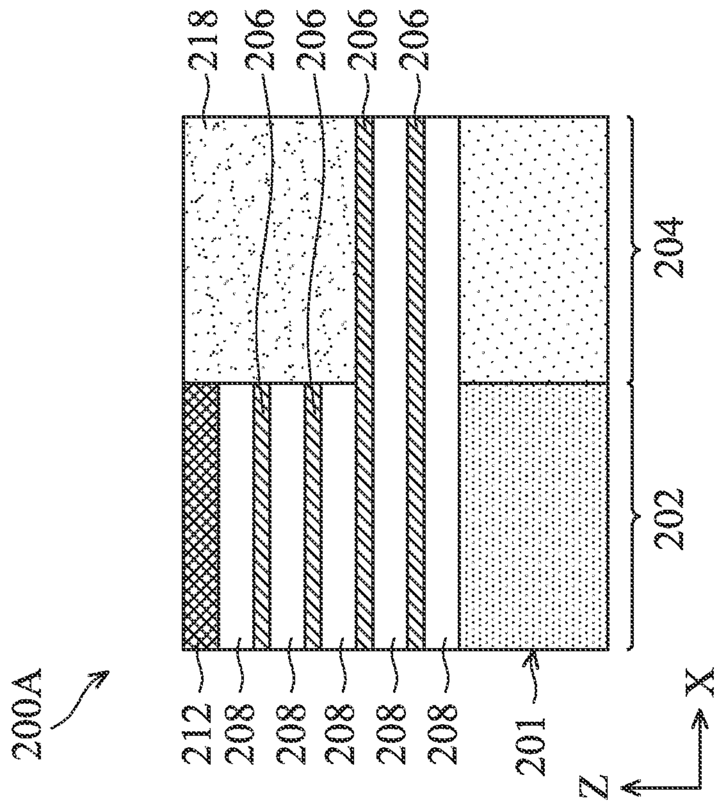
Figure 5A:
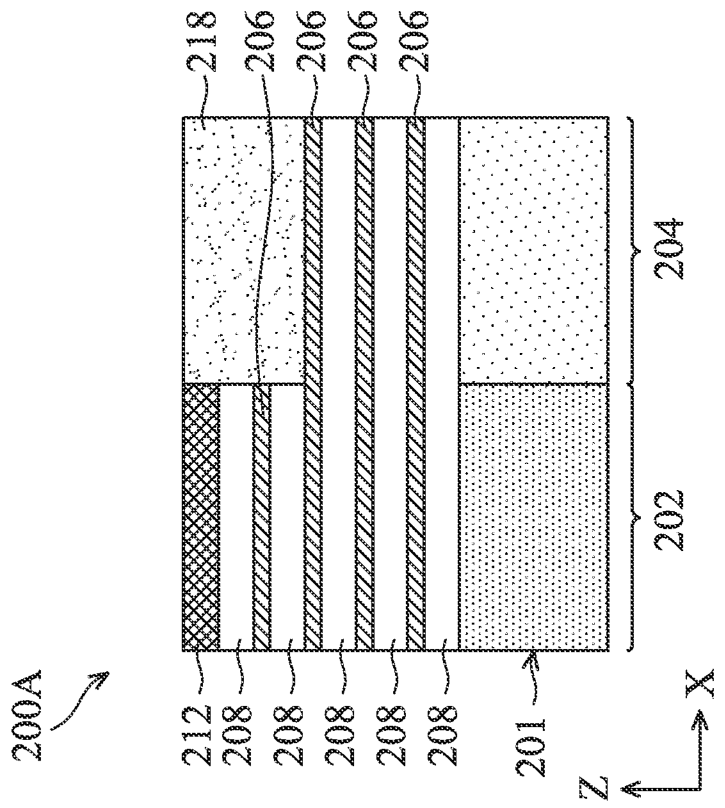
Figure 6A:
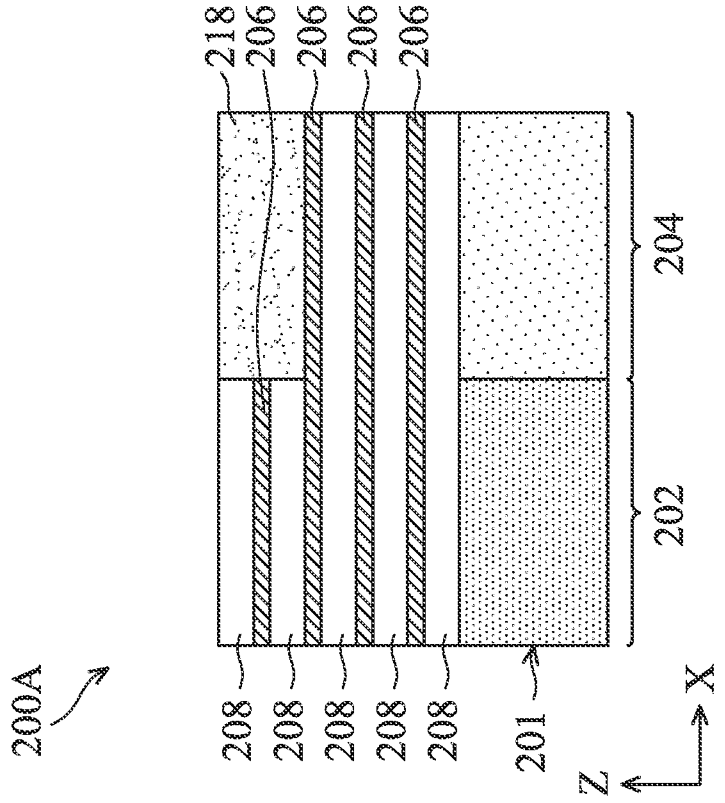
Figure 6B:
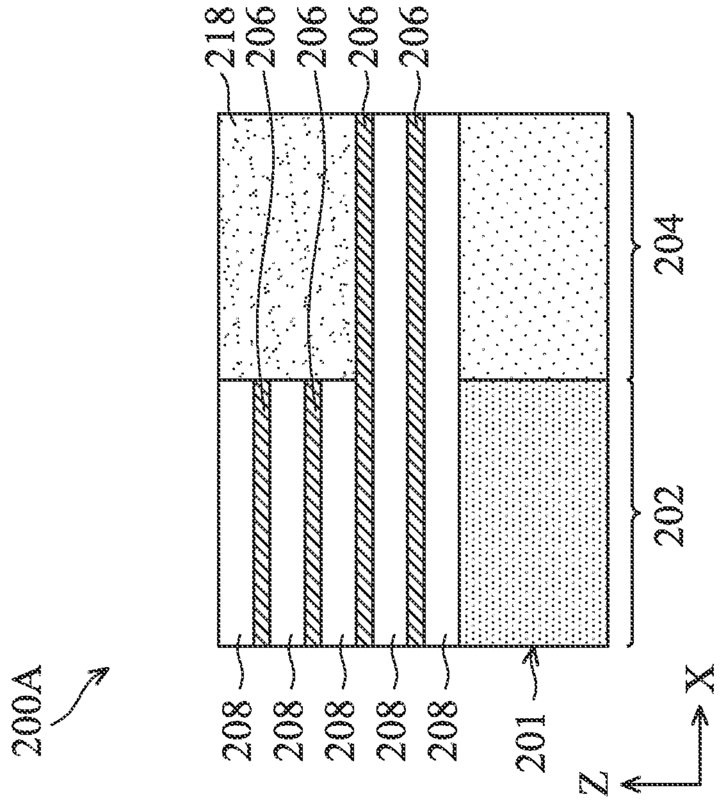
Figure 7:
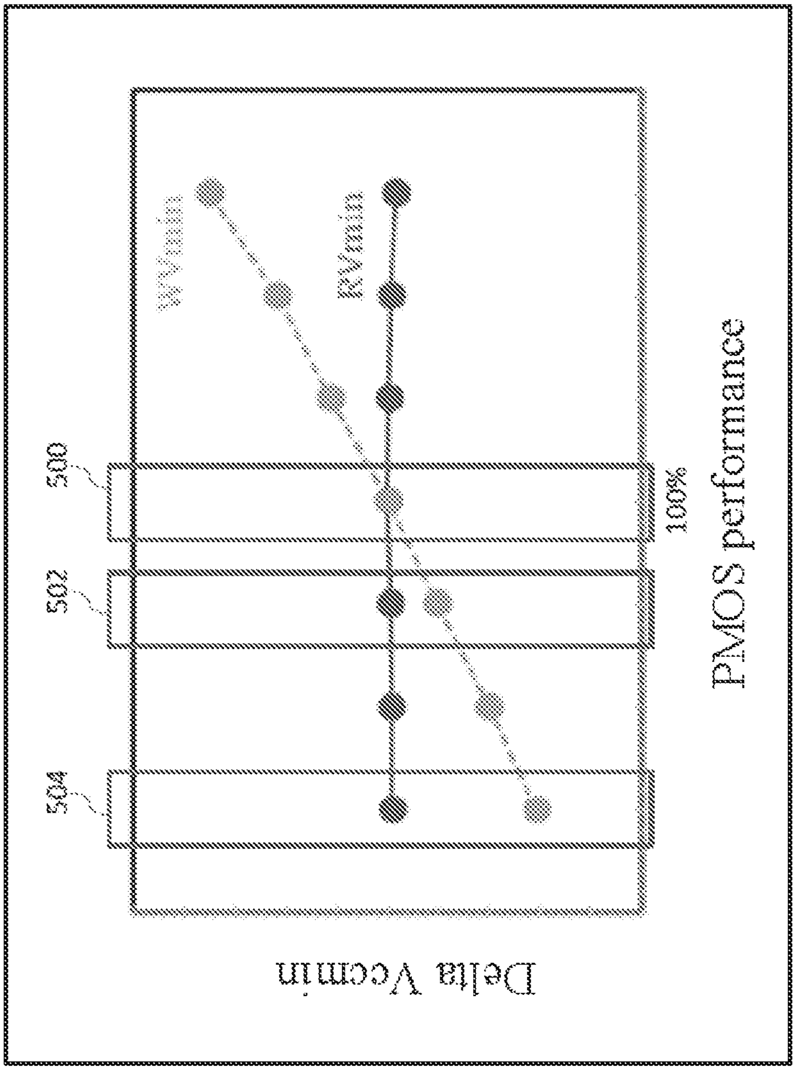
FIG. 7 is a graph illustrating simulation results that correlate a difference in the number of channel layers, PMOS performance, and change in minimum voltage required for reading and writing operations of an SRAM cell according to various aspects of the present disclosure.
Figure 8:
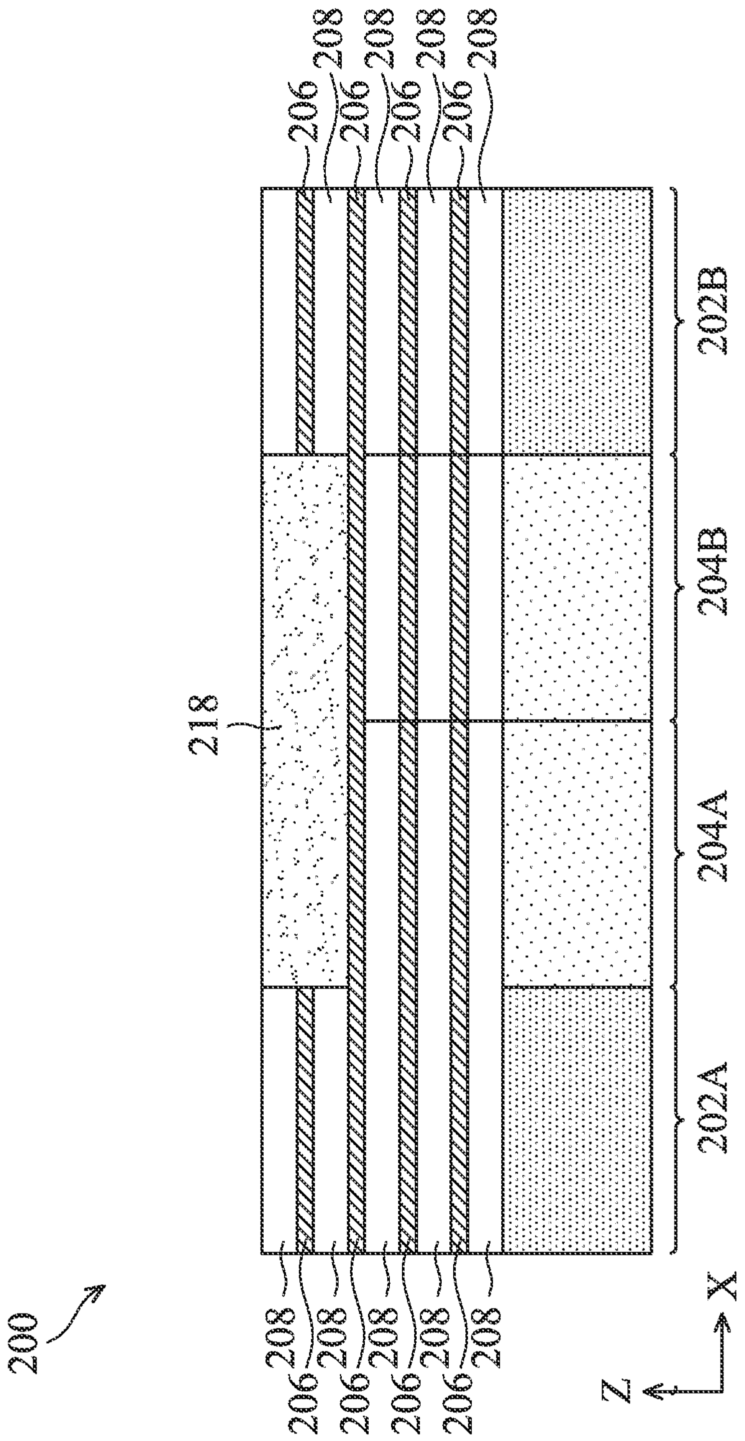
Figure 9B:
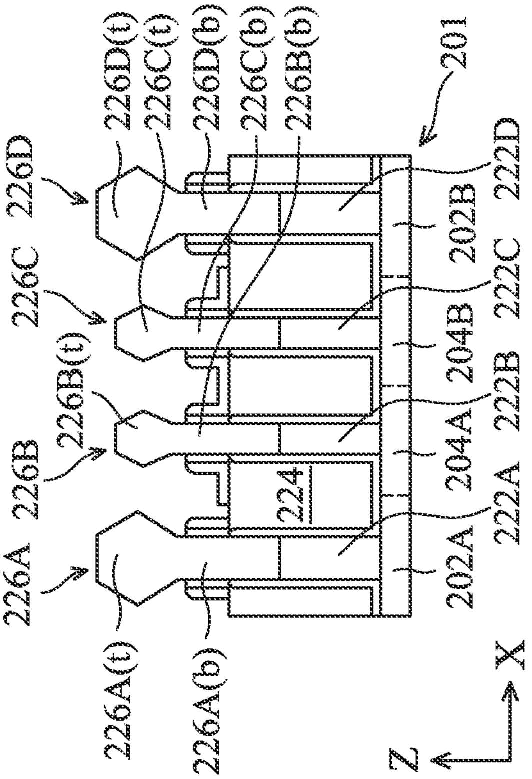
FIGS. 9B and 10B are fragmentary cross-sectional views of the SRAM cell of FIG. 1C and FIG. 1D in a source/drain region, along the x-z plane illustrated by the line B-B' of FIG. 1C, at the stage corresponding to that of FIGS. 9A and 10A, respectively, according to various aspects of the present disclosure.
Figure 10B:
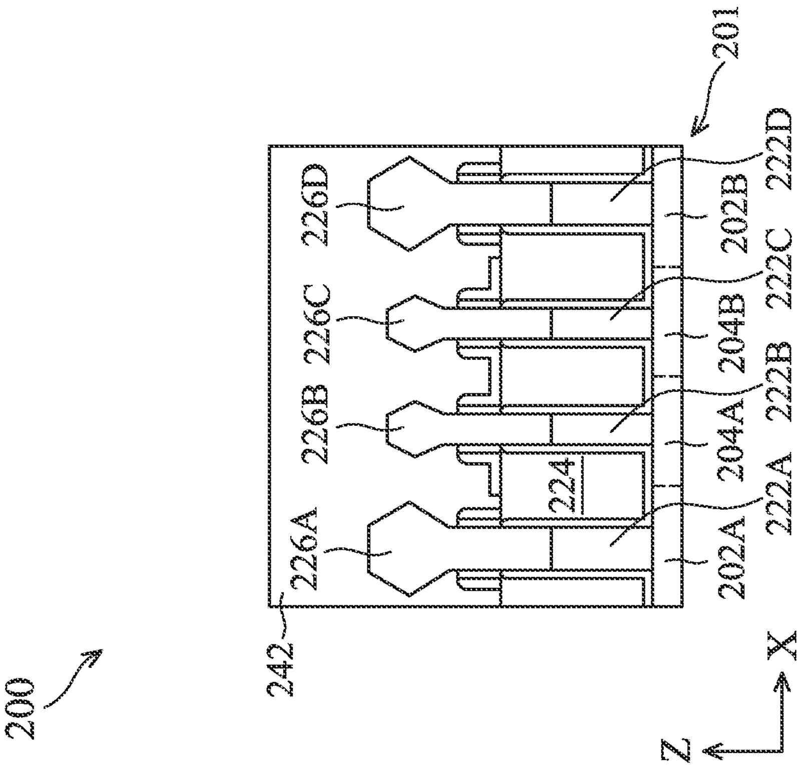
Figure 11:
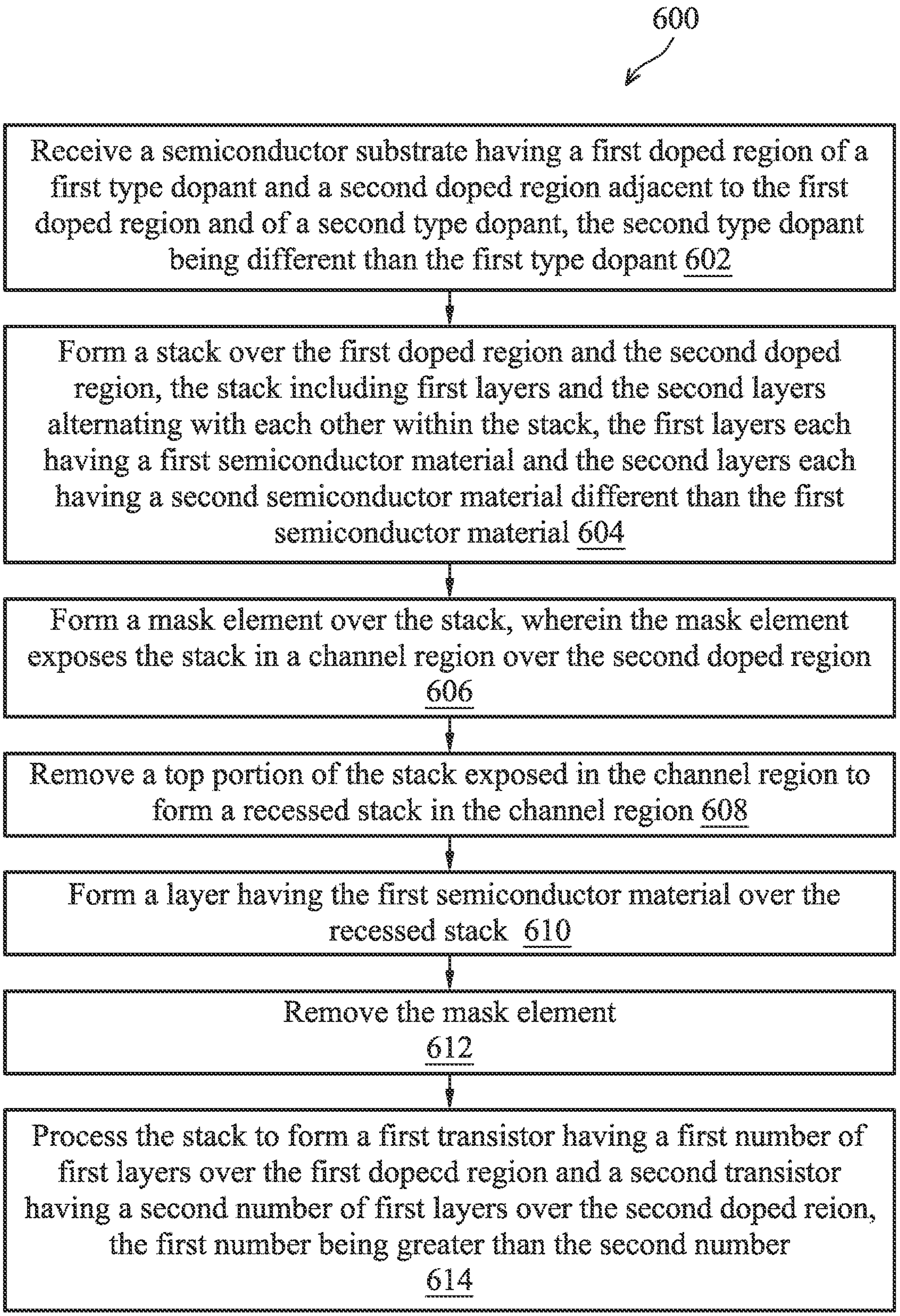
FIG. 11 is a flow chart of a method for fabricating a memory chip according to various aspects of the present disclosure.
Figure 12:
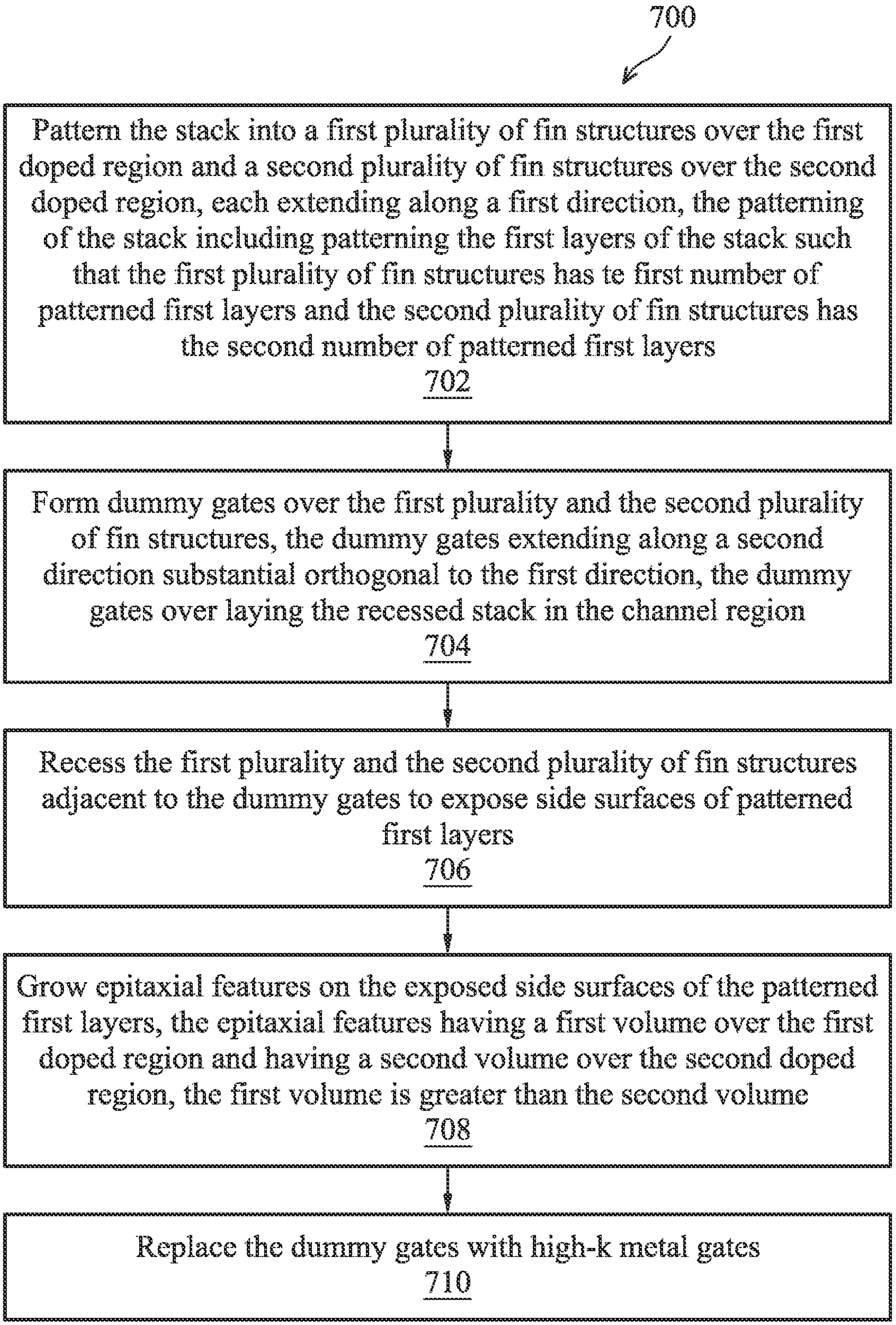
FIG. 12 is a flow chart illustrating one exemplary method of implementing a block of FIG. 11, according to various aspects of the present disclosure.

FIGS. 2, 3, 4A, 4B, 5A, 5B, 6A, 6B, 8, 9A, and 10A, are fragmentary cross-sectional views of the SRAM cell 200 in a channel region (for example, along an x-z plane illustrated by the line A-A' of FIG. 1C) of a GAA transistor, at different stages of processing, according to various aspects of the present disclosure. FIGS. 9B and 10B are fragmentary cross-sectional views of the SRAM cell 200 in a source/drain region (for example, along the x-z plane illustrated by the line B-B' of FIG. 1C) of the GAA transistor, at the stage of processing corresponding to that of FIGS. 9A and 10A, respectively, according to various aspects of the present disclosure. FIGS. 9C and 10C are fragmentary cross-sectional views of the SRAM cell 200 along a longitudinal direction of a fin structure of an n-type device (for example, along a y-z plane illustrated by the D-D' line of FIG. 1C), at the stage corresponding to that of FIGS. 9A and 10A, respectively, according to various aspects of the present disclosure. FIGS. 9D and 10D are fragmentary cross-sectional views of the SRAM cell 200 along a longitudinal direction of a fin structure of a p-type transistor (for example, along a y-z plane illustrated by the C-C' line of FIG. 1C), at the stage corresponding to that of FIGS. 9A and 10A, respectively, according to various aspects of the present disclosure. FIG. 9E is an expanded perspective cross-sectional view illustrating the top portions of the epitaxial source/drain features of the FIG. 9B in relation to the channel layers of the FIG. 9A. FIG. 7 is a graph illustrating simulation results that correlate the difference in the number of channel layers and the change in minimum voltage required for reading and/or writing operations. FIGS. 11 and 12 are flow charts illustrating exemplary methods for implementing the method according to various aspects of the present disclosure.

While subsequent descriptions reference SRAM cell 200, it is understood that the same or similar method may be applied to other types of SRAM cells as well, such as to SRAM cell 100, and/or other types of memory cells.

Figure 2:
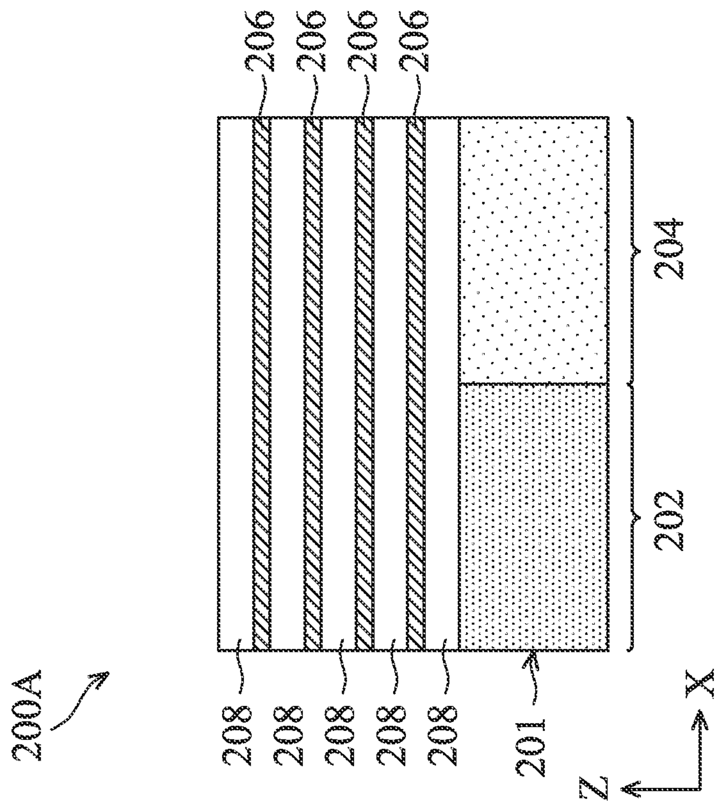

Referring to FIG. 2 and block 602 of FIG. 11, the method starts with receiving a substrate 201. In the depicted embodiment, substrate 201 includes silicon (Si). Alternatively or additionally, substrate 201 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as silicon germanium (SiGe), SiPC, GaAsP, AlInAs, AlGaAs, GaInAs, GaInP, and/or GaInAsP; or combinations thereof. Alternatively, substrate 201 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrate can be fabricated using separation by implantation of oxygen (SIMOX), wafer bonding, and/or other suitable methods.

Still referring to FIG. 2 and block 602 of FIG. 11, different portions of the substrate 201 is doped with different dopants, according to design requirements of the SRAM cell 200, to form regions of different conductivity types (such as p-type conductivity or n-type conductivity). For example, a first portion of the substrate 201 is doped with a p-type dopant, thereby forming a p-type doped region 202, and a second portion of the substrate 201 is doped with an n-type dopant, thereby forming an n-type doped region 204. The n-type doped region 204 is configured for p-type metal-oxide-semiconductor (MOS) transistors (PMOS transistors), such as pull-up (PU) transistors, and the p-type doped region 202 is configured for n-type MOS transistors (NMOS transistors), such as pull-down (PD) transistors and pass-gate (PG) transistors. The n-type dopants include, for example, phosphorus, arsenic, other n-type dopant, or combinations thereof. The p-type dopants include, for example, boron, boron fluoride ($BF_2$), indium, other p-type dopant, or combinations thereof. The p-type doped region 202 and the n-type doped region 204 may be positioned in any relative position to one another. The substrate 201 may have a plurality of p-type doped regions 202 (such as p-type doped regions 202A, 202B, etc.) and a plurality of n-type doped regions 204 (such as n-type doped regions 204A, 204B, etc.).

Still referring to FIG. 2 and block 604 of FIG. 11, a stack of semiconductor layers are formed over the substrate 201, such as over the p-type doped region 202 and the n-type doped region 204. The stack may extend vertically (e.g., along the z-direction) from the substrate 201. In an embodiment, the stack includes semiconductor layers of two different materials that alternate with each other within the stack. For example, a semiconductor layer 208 is disposed over the substrate 201, a semiconductor layer 206 is disposed over the semiconductor layer 208, and another semiconductor layer 208 is disposed over the semiconductor layer 206, so on and so forth. The material compositions of the semiconductor layers 206 and 208 are configured such that they have an etching selectivity in a subsequent etching process. For example, in the depicted embodiments, the semiconductor layers 206 contain silicon germanium (SiGe), while the semiconductor layers 208 contain silicon (Si). Alternatively, the semiconductor layers 208 contain SiGe, while the semiconductor layers 206 contain Si. In the depicted embodiments, there are four (4) layers of semiconductor layers 206 and five (5) layers of semiconductor layers 208 alternating between each other. However, there may be any appropriate number of layers in the stack. For example, there may be 2-10 layers of semiconductor layers 206, alternating with 2-10 layers of semiconductor layers 208 in the stack. If the number of the layers is too small, such as less than 2, the benefit afforded by GAA structures no longer exist due to the loss of GAA features; while if the number of the layers is too large, the benefit afforded by GAA structures is offset by the substantially increased processing cost associated with, for example, to ensure proper filling of gate materials between lower channel layers. In the depicted embodiment, each of the semiconductor layers 206 and each of the semiconductor layers 208 may have substantially the same thickness. However, in some embodiments, each of the semiconductor layers 206 may have a same or different thickness from one another; and/or each of the semiconductor layers 208 may have a same or different thickness from one another. Further, a semiconductor layer 208 may have a same or different thickness from a semiconductor layer 206. In the depicted embodiment, the semiconductor layers 208 are designed to form the channel layers of the subsequently formed transistors (therefore also interchangeably referred to as the channel layers 208); and the semiconductor layers 206 are designed to be the etching-stop layers during the processing and eventually removed in the final device. In the depicted embodiment, the top layer of the stack is a semiconductor layer 208. Alternatively, the top layer of the stack may be a semiconductor layer 206.

Figure 3:
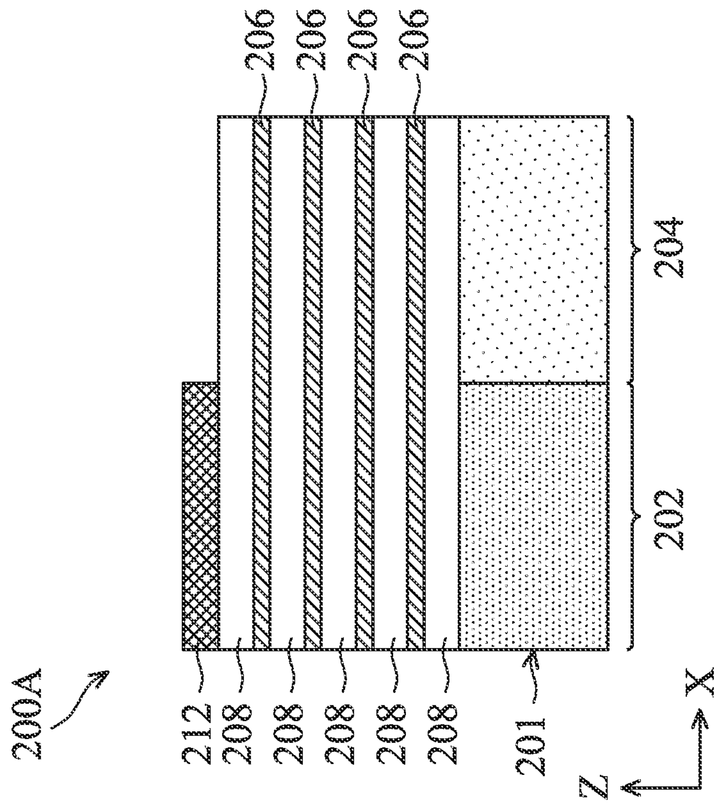
FIGS. 2, 3, 4A, 4B, 5A, 5B, 6A, 6B, 8, 9A, and 10A, are fragmentary cross-sectional views of the single-port SRAM cell of FIG. 1C and FIG. 1D in a channel region, along an x-z plane, illustrated by the line A-A' of FIG. 1C, at different stages of the processing, according to various aspects of the present disclosure.

Referring to FIG. 3 and block 606 of FIG. 11, the method proceeds to form a hard mask layer 212 over the stack to cover at least a channel region of the stack over the p-type doped region 202, while exposing at least a channel region of the stack over the n-type doped region 204. In some embodiments, the hard mask layer 212 covers an entirety of the stack over the p-type doped region 202, and exposes an entirety of the stack over the n-type doped region 204. Alternatively, the hard mask layer 212 may cover only a channel region of the stack over the p-type doped region 202, while leaving not only the channel region of the stack over the n-type doped regions 204 but also the source regions and the drain regions (collectively, the source/drain regions) of the stack over the p-type doped regions 202 exposed. The hard mask layer 212 may be of any suitable hard mask layer materials and may be formed by any suitable methods.

Referring to FIGS. 4A-6A, 4B-6B, and block 608 of FIG. 11, an etching process is conducted to remove a top portion of the stack in the region not covered by the hard mask layer 212. In other words, the stack is recessed in the region not covered by the hard mask layer 212. In the depicted embodiment, the entire stack over the n-type doped region 204, not covered by the hard mask layer 212, may be recessed by the etching process. Alternatively, a channel region of the stack over the n-type doped region 204, not covered by the hard mask layer 212, is recessed by an etching process. This etching process (described in more detail below) is designed to cause a final structure of a p-type transistor formed in the n-type doped region 204, to include fewer channel layers than a n-type transistor formed in the p-type doped region 202. As explained above, the smaller number of channel layers may lead to reduced current level through the channel layers, thereby improving overall current level balance of SRAM cell 200. Therefore, the difference between the number of channel layers (thereby the size of the top portion removed) depends on the design requirements, such as a designed difference in the magnitude of current levels between the n-type transistors and the p-type transistors. If the difference is too large, the current level in p-type transistors may be too low to ensure proper reading function. Conversely, if the difference is too small, the current level in p-type transistors may be too high to ensure reliable writing operations.

The number of channel layers proper to achieve a designed current level difference may be decided based on simulation results that correlate the difference in the number of channel layers, the change in p-type transistor performance, and the change in the minimum voltage required for reading and/or writing operations. For example, FIG. 7 illustrates simulation results on the effect of smaller number of channel layers in the p-type transistor relative to the number of channel layers in the n-type device on the performance of the p-type transistor, as well as on the change in minimum voltage ($\Delta V_{cc\text{-}min}$) for reading and writing operations. In FIG. 7, box 500 illustrates a scenario where the p-type transistor has the same number of channel layers as the n-type device. Box 502 illustrates a scenario where the p-type transistor has one fewer channel layer than the n-type device; and box 504 illustrates a scenario where the p-type transistor has two fewer channel layers than the n-type device. As illustrated, the $\Delta V_{cc\text{-}min}$ of the SRAM cell 200 in reading operations are relatively insensitive to the change of number of channel layers in the p-type transistor. For example, the $\Delta V_{cc\text{-}min}$ for reading operations of SRAMs represented by box 500 is about the same as that of SRAMs represented by boxes 502 and 504. However, the $\Delta V_{cc\text{-}min}$ of the SRAM cell 200 in writing operations are correlated with the change of number of channel layers in the p-type transistor. For example, by including one fewer channel layer in a p-type transistor (such as a pull-up transistor PU) (represented by the box 502), the $\Delta V_{cc\text{-}min}$ for writing operations is reduced relative to the SRAM cell 200 with the same number of channel layers (represented by the box 500). The performance of the p-type transistor is reduced in the meantime. By including two fewer channel layers in the p-type transistor (such as a pull-up transistor PU) (represented by the box 504), the $\Delta V_{cc\text{-}min}$ for writing operations is reduced relative to the SRAM cell 200 with the same number of channel layers (represented by the box 500). In other words, to decide the difference in the number of channel layers in a p-type transistor relative to an n-type device, one would only need to look up the desired decrease in the $\Delta V_{cc\text{-}min}$ and find the corresponding number of channel layers on the curve.

The n-type transistors may have N channel layers, while the p-type transistors may have M channel layers, where N and M are both positive integers between 2 and 10. In one embodiment, the designed current level difference between the p-type and the n-type transistors may dictate that M is less than N by at least one (1). For example, M may be equal to N−1 (as illustrated in FIGS. 4A-6A); or M may be equal to N−2 (as illustrated in FIGS. 4B-6B). In one embodiment, the designed current level difference may dictate that M is between about one third (⅓) of N and two thirds (⅔) of N.

Figure 4B:
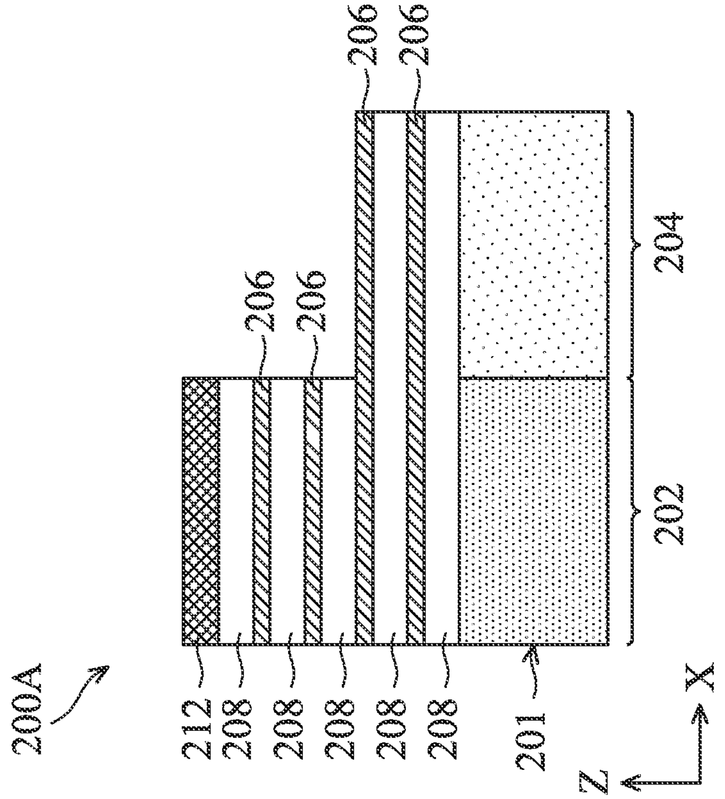
Figure 4A:
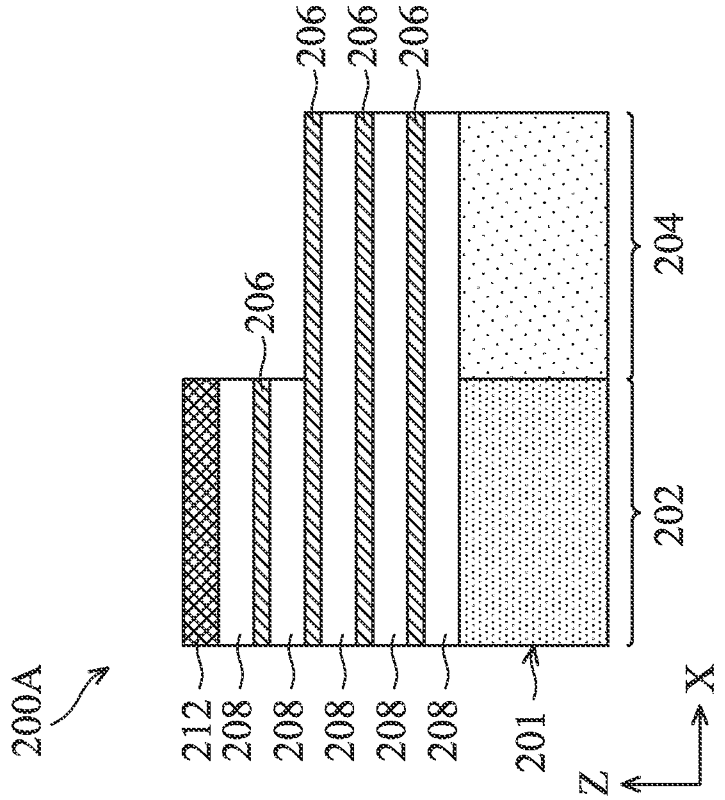

In some embodiments, the designed current level difference between the p-type and the n-type transistors may dictate that the p-type transistor includes one fewer channel layer 208 than the n-type transistor. Referring to FIG. 4A and block 608 of FIG. 11, two (2) semiconductor layers 208 are removed along with the semiconductor layer(s) 206 between them. The etching process used to remove the top portion of the stack over the n-type doped region 204 (for example, in the channel region of the stack thereof) may be any suitable processes. For example, this process may employ cyclic dry etching techniques. In some implementations, a first set of etching cycles implement a first etching gas suitable for etching the semiconductor layer 208 (here, a silicon layer) without substantially affecting the semiconductor layers 206 (here, a silicon germanium layer). As described above, this may be achieved due to the etching selectivity between the semiconductor layers 206 and 208. Accordingly, a top layer of the semiconductor layers 208 is etched. The cycle may be repeated any number of times such that the top layer of the semiconductor layers 208 is removed in its entirety, and a top layer of the semiconductor layers 206 is exposed. The time duration for each etching cycle may be the same or different from one another, depending on the characteristics of the semiconductor layer 208. For example, a surface portion of the semiconductor layer 208 may have different composition than an inner portion of the semiconductor layer 208. Accordingly, a time duration for the first and the last cycles of the first set of etching cycles may be different from the cycles between them. In some implementations, each cycle may last about 4 to 8 seconds in time duration. In some embodiments, a total of 5 to 10 cycles of the first etching gas may be required to completely remove a top layer of the semiconductor layer 208.

Subsequently, a second set of etching cycles implement a second etching gas suitable for etching the semiconductor layers 206, without substantially etching the semiconductor layers 208. Accordingly, a top layer of the semiconductor layers 206 now exposed on the top surface is etched, similar to the etching of the semiconductor layer 208. The cycle may also be repeated any number of times with the same or different time durations, such that the top layer of the semiconductor layers 206 is removed in its entirety, and a second layer of the semiconductor layers 208 is exposed on the top surface. A total of 5 to 10 cycles of the second etching gas may be required. This cyclic etching process may be repeated until the desired number of semiconductor layers 208 and semiconductor layers 206 are removed according to the design requirements. In some implementations, the thicknesses of each of the semiconductor layers 208 and/or each of the semiconductor layers 206 differ from each other. Accordingly, the time duration implemented to remove each semiconductor layer 208 may be different from one implemented to remove each semiconductor layer 206. In one embodiment, the etching gas used to etch the silicon-based semiconductor layer is different than the etching gas used to etch the silicon germanium-based semiconductor layer. For example, the etching gas for the silicon semiconductor layer may be selected from chlorine ($Cl_2$), hydrogen chloride (HCl), hydrogen bromide (HBr), in conjunction with helium (He) as the carrier gas. The etching gas for the silicon germanium semiconductor layer may be selected from fluorine ($F_2$), hydrogen fluoride (HF), nitrogen trifluoride ($NF_3$), in conjunction with helium (He) as the carrier gas.

Still referring to FIG. 5A and block 610 of FIG. 11, a semiconductor layer 218, comprising the same semiconductor material as the that of the semiconductor layers 208 (here, Si), is formed epitaxially over the recessed portion of the stack (such as the recessed stack in the n-type doped region 204, or a channel region of the recessed stack thereof) such that a top surface of the semiconductor layer 218 extends along or above the top surface of the stack (e.g. in the p-type doped region 202). Any suitable method may be used to form the semiconductor layer 218, such as CVD deposition techniques (for example, vapor-phase epitaxy (VPE), ultra-high vacuum CVD (UHV-CVD), LPCVD, and/or PECVD), molecular beam epitaxy, other suitable selective epitaxial growth (SEG) processes, or combinations thereof. Referring to FIG. 6A and block 612 of FIG. 11, a chemical mechanical polishing (CMP) process is conducted to remove the hard mask layer 212 and producing a planar surface across the n-type doped region 204 and the p-type doped region 202. As illustrated in FIG. 6A, the stack over the n-type doped region 204 now has three (3) layers comprising silicon, that is, two (2) layers of semiconductor layer 208, and one layer of semiconductor layer 218; while the stack over the p-type doped region 202 has four (4) semiconductor layers 208. In other words, the stack in the n-type doped region 204 (or a channel region thereof) includes one fewer silicon layer than the stack in the p-type doped region 202. Similarly, the stack in the n-type doped region 204 (or a channel region thereof) now also has one fewer semiconductor layer 206 (here, silicon germanium) than the stack in the p-type doped region 202. The semiconductor layer 218 has a thickness about the same as the sum of the thicknesses for the top two layers of semiconductor layers 208 and the top layer of semiconductor layer 206 in the p-type doped region 202.

Alternatively, in some embodiments, the designed current level difference may dictate that the p-type transistor includes two fewer layers of semiconductor layers 208 (in other words, two fewer channel layers) than the n-type transistor. Referring to FIG. 4B, 5B, 6B, and block 608 of FIG. 11, the etching process removes three (3) semiconductor layers 208 along with two (2) semiconductor layers 206 interposed between them. An epitaxially layer 218 (here, Si layer) is grown over the recessed stack in the n-type doped region (FIG. 5B), with a method similar to that described above with respect to FIG. 5A. A CMP process is conducted, leaving the stack over n-type doped region 204 with two fewer layers of semiconductor layers 208 than the stack over the p-type doped region 202 (FIG. 6B). Similarly, the stack over the n-type doped region 204 also has two fewer semiconductor layers 206 than the stack over the p-type doped region 202. The semiconductor layer 218 has a thickness about the same as the sum of thicknesses for the top three (3) layers of semiconductor layers 208 and the top two (2) layers of semiconductor layer 206 in the p-type doped regions 202.

As described above, a plurality of n-type doped regions and a plurality of p-type doped regions may be formed in the substrate 201 with the method described above with respect to FIGS. 4A-6A and/or FIGS. 4B-6B. Referring to FIG. 8, two n-type doped regions 204A and 204B are formed adjacent to each other; and two p-type doped regions 202A and 202B are formed on both sides of the two n-type doped regions 204A and 204B. Each of the p-type doped regions 202A and 202B may be formed together or separately; and each of the n-type doped regions 204A and 204B may be formed together or separately. The two n-type doped regions 204A and 204B may each have a number of channel layers that are less than the number of channel layers of the two p-type doped regions 202A and 202B. For example, in the depicted embodiment of FIG. 8, the two p-type doped regions 202A and 202B each have five (5) semiconductor layers 208, and the two n-type doped regions 204A and 204B each have three (3) semiconductor layers 208. Additionally, the two n-type doped regions 204A and 204B each have one (1) semiconductor layer 218 disposed over the stack of semiconductor layers 208. In the depicted embodiment, both the semiconductor layer 218 and the semiconductor layers 208 are silicon layers; and the semiconductor layers 206 are silicon germanium layers. Accordingly, the two p-type doped regions 202A and 202B each have five silicon layers; and the two n-type doped regions 204A and 204B each have four silicon layers. Furthermore, the top silicon layers in the two n-type doped regions 204A and 204B each have a thickness greater than the top silicon layer in the two p-type doped regions 202A and 202B. For example, the top silicon layers in the two n-type doped regions 204A and 204B each have a thickness equal to the sum of the thicknesses of the two top silicon layers and the thickness of the top silicon germanium layer in the two p-type doped regions 202A and 202B. Similarly, the two n-type doped regions 204A and 204B each have three (3) semiconductor layers 206, and the two p-type doped regions 202A and 202B each have four (4) semiconductor layers 206. In the depicted embodiment, all doped regions of the same conductivity types have the same number of semiconductor layers 208 and the same number of semiconductor layers 206. Alternatively, they may have different number of semiconductor layers 208 and/or 206 depending on design requirements.

Referring to FIGS. 9A-9D and block 614 of FIG. 11, n-type transistors are formed in the p-type doped regions 202A and 202B; and p-type transistors are formed in the n-type doped region 204. Any suitable methods may be used to form these transistors. One exemplary method 700 is briefly provided below with respect to FIG. 12. In other words, method 700 is a blow-out flow chart diagram for the block 614 of FIG. 11. Further details of the method may be found in other applications such as U.S. patent application Ser. No. 16/657,606 filed on Oct. 18, 2019, entitled "Structure and Method for Gate-All-Around Metal-Oxide-Semiconductor Devices With Improved Channel Configurations." The disclosure of this patent application is herein incorporated in its entirety for reference. Other suitable methods may also be used alternatively.

Figure 9A:
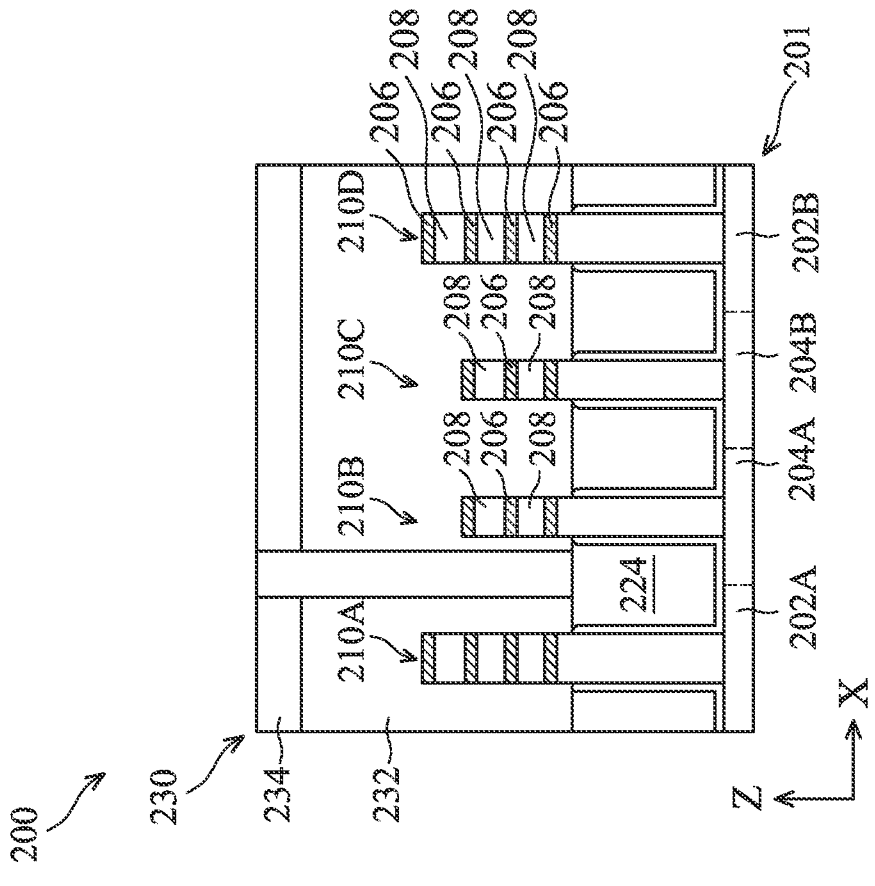
Figure 9C:
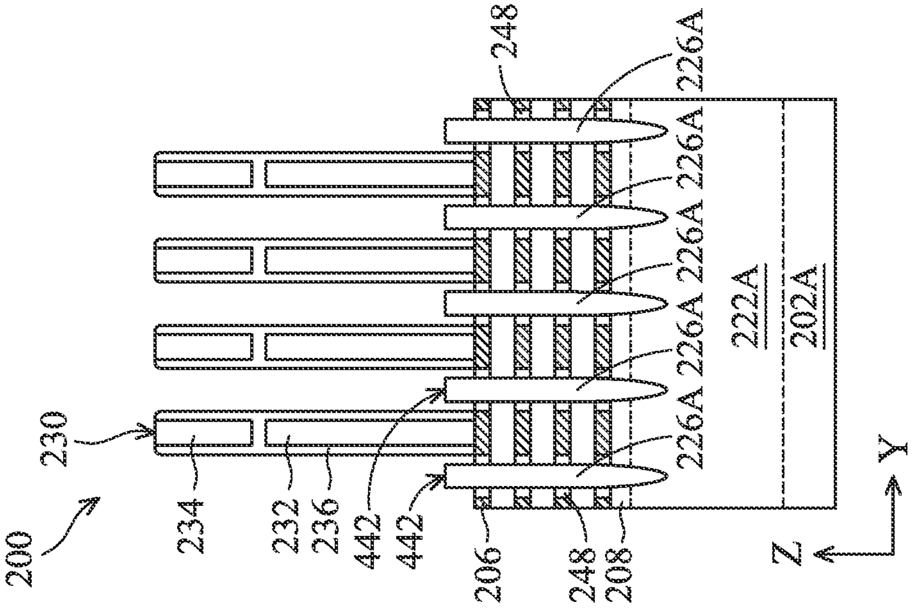
FIGS. 9C and 10C are fragmentary cross-sectional views of the SRAM cell of FIG. 1C and FIG. 1D along a longitudinal direction of a fin structure of an n-type device, along a y-z plane illustrated by the C-C' line of FIG. 1C, at the stage corresponding to that of FIGS. 9A and 10A, respectively, according to various aspects of the present disclosure.
Figure 9D:
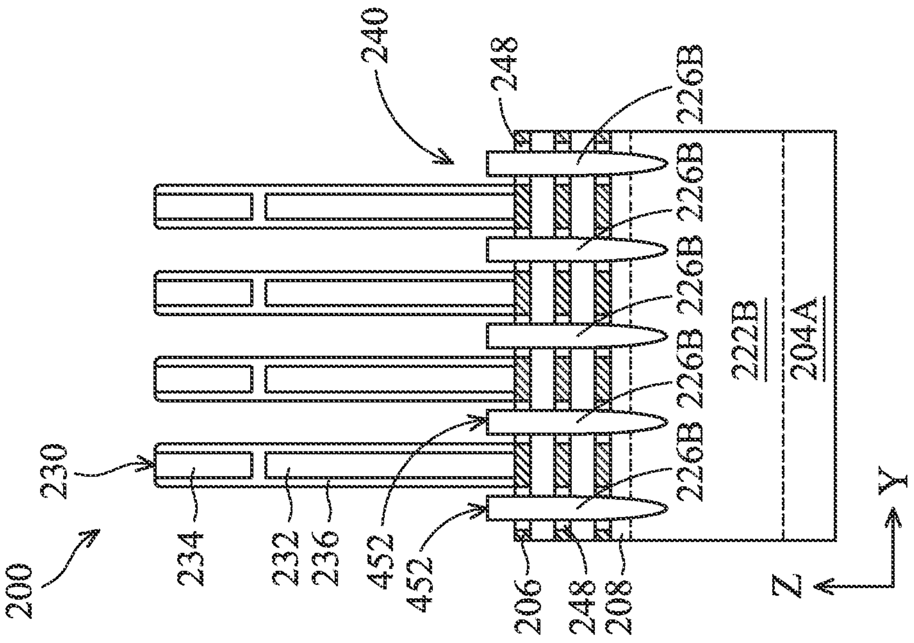
FIGS. 9D and 10D are fragmentary cross-sectional views of the SRAM cell 200 along a longitudinal direction of a fin structure of a p-type transistor, along a y-z plane illustrated by the D-D' line of FIG. 1C), at the stage corresponding to that of FIGS. 9A and 10A, respectively, according to various aspects of the present disclosure.

Referring to FIGS. 9A-9D, particularly FIG. 9A, and block 702 of FIG. 12, the stack of semiconductor layers 206 and 208 are patterned into a plurality of fin structures, for example, into fin structures (or fins) 210A-210D. Each of the fin structures 210A-210D includes a portion of the stack. The fin structures 210A-210D may be patterned by any suitable method, such as GAA processing methods. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate 201 and patterned using a photolithography process. Spacers are formed alongside the patterned sacrificial layer using a self-aligned process. The sacrificial layer is then removed, and the remaining spacers, or mandrels, may then be used to pattern the fin structures. The patterning may utilize multiple etching processes which may include a dry etching and/or wet etching. In the depicted embodiment, the etching process etches through the stack of the semiconductor layers 208 and semiconductor layers 206, and further etches into the substrate 201. Accordingly, trenches are formed in between the fin structures 210A-210D.

Subsequently, the top layer of the semiconductor layers 208 of fin structures in the p-type doped regions 202A and 202B (such as fin structures 210A and 210D) are selectively removed; and the layer 218 of fin structures in the n-type doped regions 204A and 204B (such as fin structures 210B and 210C) are selectively removed. Meanwhile, top layers of the semiconductor layers 206 are substantially preserved due to the etching selectivity. Any suitable etching method may be used to achieve the selective etching. Accordingly, each of the fin structures 210A-210D include semiconductor layers 206 and 208 disposed in an alternating manner with respect to one another. The fin structures 210A-210D each extend lengthwise horizontally in a y-direction and are separated from each other horizontally in an x-direction. As illustrated in FIG. 9A, the fin structures in the n-type doped regions 204A and 204B have a smaller number of semiconductor layers 208 and a smaller number of semiconductor layers 206 than those in the p-type doped regions 202A and 202B. Moreover, the fin structures in the n-type doped regions 204A and 204B have a top surface (that is a top surface of the top layer of the semiconductor layer 206) that extends below a top surface of the fin structures in the p-type doped regions 202A and 202B. In some embodiments, the top surface of the topmost layer of the semiconductor layers 206 in the p-type doped regions 202A and 202B extends along a top surface of the second layer (counting from the topmost layer downwards) of the semiconductor layers 206. In other words, at this processing stage, the fin structures 210A and 210D are higher than the fin structures 210B and 210C. In some embodiments, fin structures 210B and 210C in the n-type doped regions 204A and 204B have smaller lateral widths than fin structures 210A and 210D in the p-type doped region 202A and 202B, for facilitating a smaller epitaxial source/drain feature to be grown thereover.

Still referring to FIGS. 9A-9D, particularly FIGS. 9A and 9B, isolation features 224 are formed between the fin structures 210A-210D, for example, by filling the trenches with an insulator material (for example, by using a chemical vapor deposition process or a spin-on glass process) and etching back the insulator material layer to expose the stacks. Isolation feature 224 can include different structures, such as shallow trench isolation (STI) structures, deep trench isolation (DTI) structures, and/or local oxidation of silicon (LOCOS) structures, and may be single-layer or multi-layer structures. In the depicted embodiment, the isolation features 224 are shallow trench isolation (STI) features. Isolation features 224 include silicon oxide, silicon nitride, silicon oxynitride, other suitable isolation material (for example, including silicon, oxygen, nitrogen, carbon, or other suitable isolation constituent), or combinations thereof. The isolation features 224 may have a top surface that extends along a bottom surface of the stack. Alternatively, the isolation features 224 may have a top surface that extends above or below a bottom surface of the stack.

Still referring to FIGS. 9A-9D, particularly FIGS. 9A, 9C and 9D, and block 704 of FIG. 12, dummy gate structures 230 are formed over each of the fin structures 210A-210D in the channel region, and over the isolation features 224 in between the fin structures 210A-210D. The dummy gate structures 230 may be configured to extend lengthwise in parallel to each other, for example, each along the x-direction. In some embodiments, the dummy gate structures 230 each wrap around the top surface and side surfaces of each of the fin structures. Because the fin structures 210A and 210D are higher than the fin structures 210B and 210C, the dummy gate structure 230 has an interface with the fin structures 210A and 210D that is higher than its interface with the fin structures 210B and 210C. In other words, the dummy gate structure 230 has a greater thickness along the Z-direction over the fin structures 210A and 210D than over the fin structures 210B and 210C. The dummy gate structures 230 may include dummy gate electrode layer 232. The dummy gate electrode layers 232 may include polysilicon. In some embodiments, the dummy gate structures 230 also include one or more mask layers, such as hard mask layer 234, which are used to pattern the dummy gate electrode layers. The dummy gate structures 230 may be formed by a procedure including deposition, lithography patterning, and etching processes. The deposition processes may include CVD, ALD, PVD, other suitable methods, and/or combinations thereof.

Gate spacers 236 are formed on the sidewalls of the dummy gate structures 230. The gate spacers 236 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 236 may include a single layer or a multi-layer structure. In some embodiments, the gate spacers 236 may have thicknesses in the range of a few nanometers (nm). In some examples, one or more material layers (not shown) may also be formed between the dummy gate structures 230 and the corresponding gate spacers. The one or more material layers may include an interfacial layer and/or a high-k dielectric layer.

Still referring to FIGS. 9A-9D, particularly to FIGS. 9B, 9C and 9D, and block 706 of FIG. 12, portions of the fin structures 210A-210D exposed by the dummy gate structures 230 (e.g. in the source/drain regions) are at least partially recessed (or etched away) to form source/drain trenches for subsequent epitaxial source and drain growths. Meanwhile, the portions underneath the dummy gate structures 230 and underneath the gate spacers 236 remain intact. Meanwhile, the remaining portions of the fin structures 210A-210D form base fins 222A-222D. In the depicted embodiments, as illustrated in FIGS. 9B and 9C, the exposed portions of the fin structures 210A-210D are recessed in the source/drain regions to a depth below a bottom surface of the lowest channel layer 208. This configuration is advantageous in that all channel layers in the subsequently formed transistors will be operational as charge carrier conduits during operation. In some embodiments (not shown), the exposed portions of the fin structures 210A-210D are recessed in the source/drain regions to a depth along or above the bottom surface of the lowest channel layer 208. This configuration is advantageous in ensuring proper control of the bottom region of the gate in subsequently formed transistors during operation. In the depicted embodiment, the base fins 222A-222D each have a top surface below the top surface of the isolation features 224. The recess process may include multiple lithography and etching steps, and may use any suitable methods, such as dry etching and/or wet etching.

The recessing of the exposed fin structures 210A-210D in the source/drain regions forms source/drain trenches that expose the sidewalls of the remaining stack of semiconductor layers 206 and 208. Portions of the semiconductor layers 206 are removed through the exposed sidewall surfaces in the trenches via a selective etching process. The selective etching process may be any suitable processes, such as a wet etching. The extent to which the semiconductor layers 206 are recessed (or the size of the portion removed) is determined by the processing conditions such as the time duration during which the semiconductor layers 206 are exposed to an etching chemical. This selective etching process extends the source/drain trenches into areas between the ends of the vertically adjacent semiconductor layers 208. Meanwhile, the semiconductor layers 208 are only slightly affected during the selective etching process due to the etching selectivity between the layer materials. A dielectric material is deposited into the extended source/drain trenches, and then etched back such that it fills only the portions between the ends of vertically adjacent semiconductor layers 208. These remaining dielectric materials become the inner spacers 248. The inner spacers 248 protect the subsequently formed epitaxial source/drain features from damages in a subsequent gate replacement process and ensure proper electrical insulation between the epitaxial source/drain features and the gate electrode. The dielectric material may be selected from silicon oxide ($SiO_2$), silicon oxynitride (SiON), silicon oxycarbide (SiOC), silicon oxycarbonitride (SiOCN), or combinations thereof.

Still referring to FIGS. 9A-9D, particularly to FIGS. 9B, 9C and 9D, and block 708 of FIG. 12, epitaxial source/drain features 226A-226D are then formed in the unoccupied source/drain trenches, such as on sidewalls of the semiconductor layers 208 and on sidewalls of the inner spacers 248. As illustrated in FIGS. 9C and 9D, each of the semiconductor layers 208 connects two epitaxial source/drain features 226A-226D; each of the semiconductor layers 206, in conjunction with the inner spacers 248 on both sides, also connects two epitaxial source/drain features 226A-226D. It is understood that the semiconductor layers 208 function as a portion of a transistor channel of the final device. Multiple processes including etching and growth processes may be employed to grow the epitaxial source/drain features 226A-226D. For example, an epitaxy growth process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy growth process can use gaseous and/or liquid precursors, which interact with the composition of base fins 222A-222D. An etching process is used, in conjunction with the growth process, to modulate the size and the shape of the epitaxial source/drain features 226A-226D (described in more details below). Any suitable etching method may be used, including for example, wet etching methods and dry etching methods.

Epitaxial source/drain features 226A-226D are doped with n-type dopants and/or p-type dopants, for example, with an in-situ method or with an ex-situ method. In some embodiments, the epitaxial source/drain features 226A and 226D (for n-type transistors) each include an n-type dopant and are formed from epitaxial layers including silicon or silicon and carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). The epitaxial source/drain features 226B and 226C (for p-type transistors) each include a p-type dopant and are formed from epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In some implementations, epitaxial source/drain features 226A-226D include materials and/or dopants that achieve desired tensile stress and/or compressive stress in the channel region. In some implementations, epitaxial source/drain features 226A-226D are doped during deposition by adding impurities to a source material of the epitaxy process. In some implementations, epitaxial source/drain features 226A-226D are doped by an ion implantation process subsequent to a deposition process. In some implementations, annealing processes are performed to activate dopants in epitaxial source/drain features 226A-226D and/or other source/drain regions, such as HDD regions and/or LDD regions. In some implementations, silicide layers are formed on epitaxial source/drain features 226A-226D.

Still referring to FIGS. 9A-9D, and particularly to FIG. 9B, the size and the shape of the epitaxial source/drain features 226A-226D may be controlled with the combination of epitaxial growth and etching processes, for example, by alternating between epitaxial growth and etching processes. This forms epitaxial source/drain features having the size and shape according to design requirements. For example, the epitaxial features 226A-226D may each have a base portion 226A(b)-226D(b) extending from a top surface of the base fins 222A-222D, and a top portion 226A(t)-222D(t) having a hexagonal shape and extending from the base portions 226A(b)-226D(b). The top portions 226A(t) and 226D(t) may have a size greater than that of the top portions 226B(t) and 226C(t). For example, the top portions 226A(t) and 226D(t) may each have a volume $D_1$, and the top portions 226B(t) and 226C(t) may have a volume $D_2$, and a ratio between the volumes, $D_2$:$D_1$ is about 1:2 to about 9:10. In other words, the top portions 226B(t) and 226C(t) are smaller than the top portions 226A(t) and 226D(t) by about 10% to about 50%. Or, the top portions 226A(t) and 226D(t) are larger than the top portions 226B(t) and 226C(t) by about 11% to about 100%.

Figure 9F:
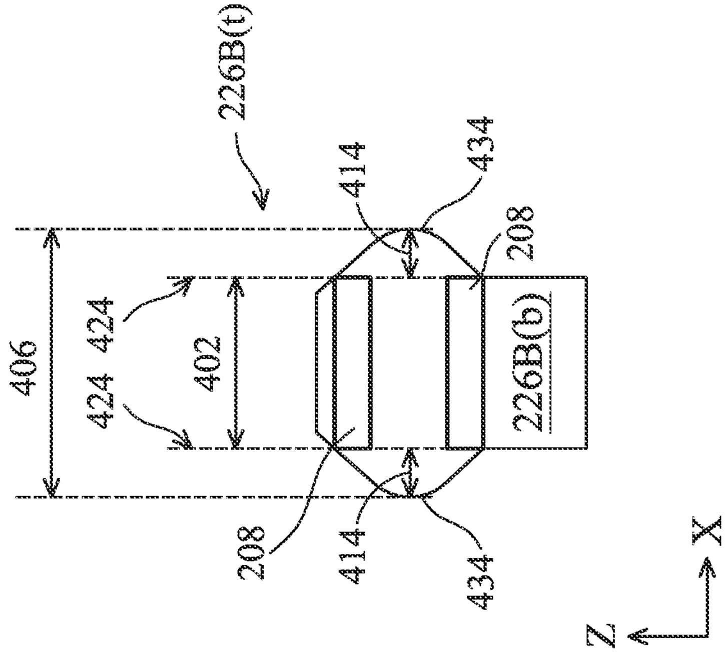
FIG. 9F is an expanded perspective cross-sectional view illustrating the top portions of epitaxial source/drain features in the n-type doped regions of the FIG. 9B in relation to the channel layers of the FIG. 9A.
Figure 9E:
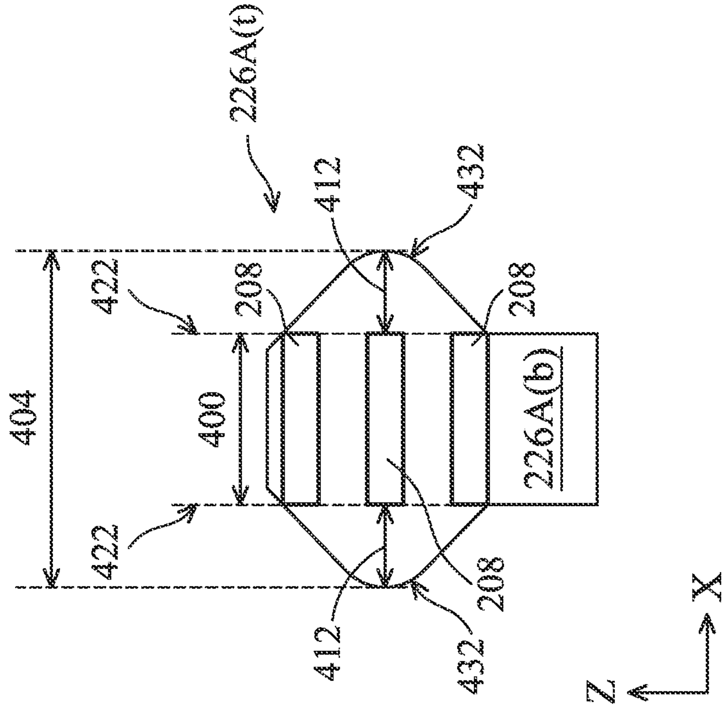
FIG. 9E is an expanded perspective cross-sectional view illustrating the top portions of epitaxial source/drain features in the p-type doped regions of the FIG. 9B in relation to the channel layers of the FIG. 9A.

FIG. 9E illustrates an expanded perspective view of (1) a cross section of the top portion of the epitaxial source/drain features 226A in p-type doped regions 202A, for example, along the B-B' line of FIG. 1C, and (2) a cross section of the channel layers 208 in p-type doped regions 202A, for example, along the A-A' line of FIG. 1C), both projected onto a same (x-z) plane for comparison. FIG. 9F illustrates an expanded perspective view of (1) a cross section of the top portion of the epitaxial source/drain features 226B in n-type doped regions 204A, for example, along the B-B' line of FIG. 1C, and (2) a cross section of the channel layers 208 in n-type doped regions 204A, for example, along the A-A' line of FIG. 1C), both projected onto a same (x-z) plane for comparison. As illustrated in FIG. 9E, the bottom portion 226A(b) and the suspended channel layers 208 over them have about the same lateral width as the base fin 222A. In the depicted embodiment, they have the same lateral width 400. The top portion 226A(t) has a profile of a diamond shape with its top corner truncated, and side corners rounded. The 226A(t) has a dimension 404 along the x-direction. Furthermore, a maximum distance between an edge surface 422 of the projection of the channel layers 208 and the side edge surface 432 of the top portion 226A(t), along the x-direction, is of the dimension 412. In the depicted embodiment, the top portions 226A(t) span a vertical distance that accommodates about three channel layers 208. Alternatively, the top portion 226A(t) may span a vertical distance that accommodates more than three channel layers 208. In the depicted embodiment, a ratio of dimension 412 to dimension 400 is about 1:1 to about 1:2, for example, about 1:1.5 to about 1:1.7. If the ratio is too large, such as larger than about 1:2, the additional charge carriers afforded by the larger epitaxial source/drain features may not all be transported through the channel layers 208 effectively during operation. Furthermore, the reduced feature-to-feature spacing may cause difficulty in avoiding leakages. If the ratio is too small, such as smaller than 1:1.5, the channel layers 208 may not be fully utilized to its capacity in transporting charge carriers. In other words, maximum efficiency is not achieved.

Similarly, as illustrate in FIG. 9F, the bottom portion 226B(b) and the suspended channel layers 208 over them have about the same lateral width as the base fin 222B. In the depicted embodiment, they have the same lateral width 402. The top portion 226B(t) has a profile of a diamond shape with its top corner truncated, and side corners rounded. The 226B(t) has a dimension 406 along the x-direction. Furthermore, a maximum distance between an edge surface 424 of the projection of the channel layers 208 and the side edge surface 434 of the top portion 226B(t), along the x-direction, is of the dimension 414. In the depicted embodiment, the top portions 226B(t) span a vertical distant that accommodates about two channel layers 208. Alternatively, the top portion 226B(t) may span a vertical distance that accommodates more than two channel layers 208. In the depicted embodiment, a ratio of dimension 414 to dimension 402 is about 1:2.5 to about 1:4, for example, about 1:3 to about 1:3.5. Similar considerations of charge carrier transportation capacity and efficacy, as well as feature-to-feature insulation, apply to the selection of these parameters. In the depicted embodiment, the dimension 402 is about the same as the dimension 400. However, alternatively, the dimension 402 may be smaller than the dimension 400 to facilitate forming smaller epitaxial source/drain feature growth in the n-type doped regions 204A and 204B.

Referring to FIGS. 9C and 9D, because the epitaxial source/drain features 226A and 226D each have greater size than the epitaxial source/drain features 226B and 226C, top surfaces 442 of the source/drain features 226A and 226D extend over top surfaces 452 of the source/drain features 226B and 226C. For example, the epitaxial source/drain features 226A-226D each have a top surface 442 that extends along the top surface of the respective topmost layer of semiconductor layers 208 in their particular regions. However, the topmost layer of the semiconductor layers 208 in the n-type doped regions 204A and 204B substantially align with the second layer of the semiconductor layers 208 in the p-type doped regions 202A and 202B. In some embodiments (not shown), the epitaxial source/drain features 226A-226D may alternatively each have top surfaces that extend above, along, or below the top surface of their respective topmost layer of semiconductor layers 208.

In some embodiments (not shown), there may be multiple adjacent fin structures in a contiguous p-type doped region. For example, there may be two adjacent fin structures in a p-type doped region 202A or a p-type doped region 202B. Epitaxial source/drain features 226A-226D may grow over each of such adjacent fin structures and laterally merge together, for example, along the x-direction. Such a configuration provides merged epitaxial source/drain features having a lateral width greater than that of an individual epitaxial source/drain feature. This configuration provides another mechanism to obtain size differentiations between epitaxial source/drain features of the different conductivity types. For example, epitaxial source/drain features 226A and 226D, each grown over two adjacent fin structures may have greater lateral widths (and sizes) than epitaxial source/drain features 226B and 226C, grown over a single fin structures.

Referring to FIGS. 10A-10D and block 710 of FIG. 12, the method proceeds to replace the dummy gate structures 230 with high-k metal gate structures (or other suitable gate structures) 220A-220D. An interlayer dielectric (ILD) 242 is deposited over the SRAM cell 200, such that it covers the substrate 201, the fin structures 210A-210D, the epitaxial source/drain features 226A-226D, and the dummy gate structures 230. In the depicted embodiment, the ILD 242 also fills the recess (or dip) 240 at the top surfaces of the epitaxial source/drain features 226B and 226C. The dummy gate structures 230 are then selectively removed, forming gate trenches in the ILD 242 (and between gate spacers 236) exposing the top and side surfaces of the stack of semiconductor layers 206 and 208 (along the x-direction). In other words, each of the semiconductor layers 208 and the remaining portions of the semiconductor layer 206 are exposed at least on two side surfaces in the gate trenches. The remaining portions of the layer 206 are then selectively removed through the gate trenches, without substantially affecting the semiconductor layer 208, for example using a suitable wet etching processes.

The removal of the remaining portions of the semiconductor layers 206 forms suspended semiconductor layers 208 and openings between vertically adjacent layers. In other words, semiconductor layers 208 are now circumferentially exposed in 360 degrees around the y-direction. A gate structure is then formed over and between the semiconductor layers 208 in the openings. For example, a high-k gate dielectric layer 228 is formed conformally on the semiconductor layers 208. In some embodiments, the high-k gate dielectric layers 228 may be formed around the exposed surfaces of each of the semiconductor layers 208, such that its wraps around each of the semiconductor layers 208 in 360 degrees. The high-k gate dielectric layer 228 contains a dielectric material having a dielectric constant greater than a dielectric constant of $SiO_2$, which is approximately 3.9. For example, the high-k gate dielectric layer 228 may include hafnium oxide ($HfO_2$), which has a dielectric constant in a range from about 18 to about 40. As various other examples, the high-k gate dielectric layers 228 may include $ZrO_2$, $YO_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layer 228 may be by any suitable processes, such as CVD, PVD, ALD, or combinations thereof. In some embodiments, an interfacial dielectric layer is conformally interposed between the high-k dielectric layer 228 and the semiconductor layers 208. This interfacial dielectric layer may improve the interface properties thereby improving the reliability of the device. Any suitable methods may be used to form the interfacial dielectric layer, such as ALD, CVD, other deposition methods, oxidation methods, such as thermal oxidation or chemical oxidation.

Figure 10A:
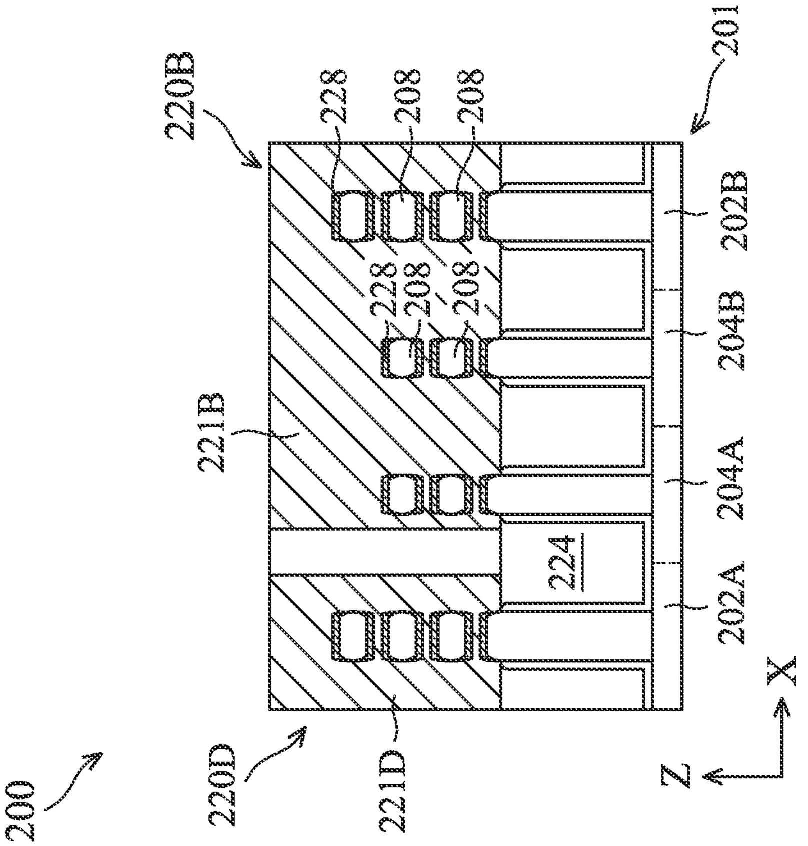
Figure 10D:
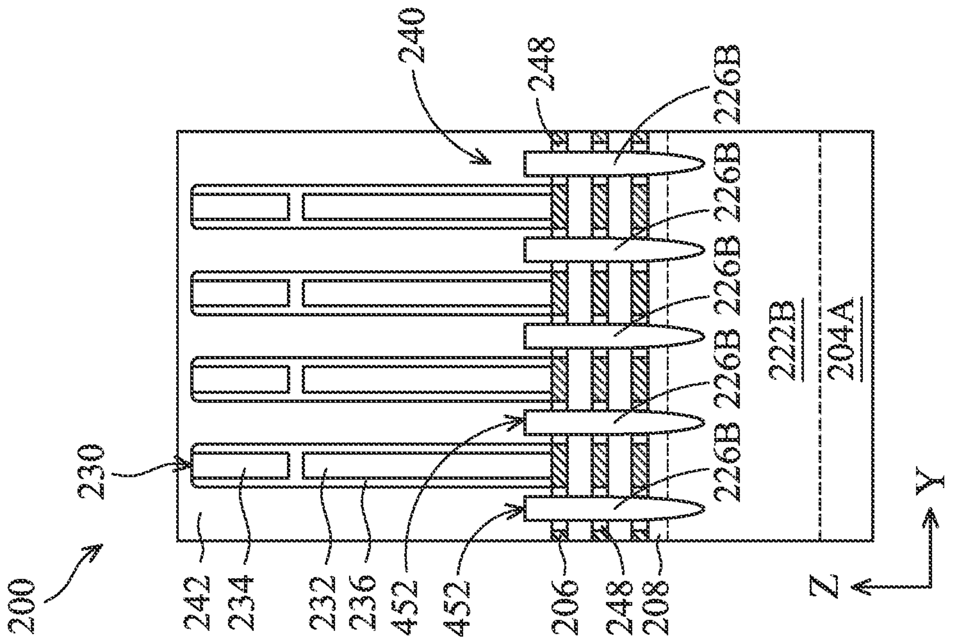
Figure 10C:
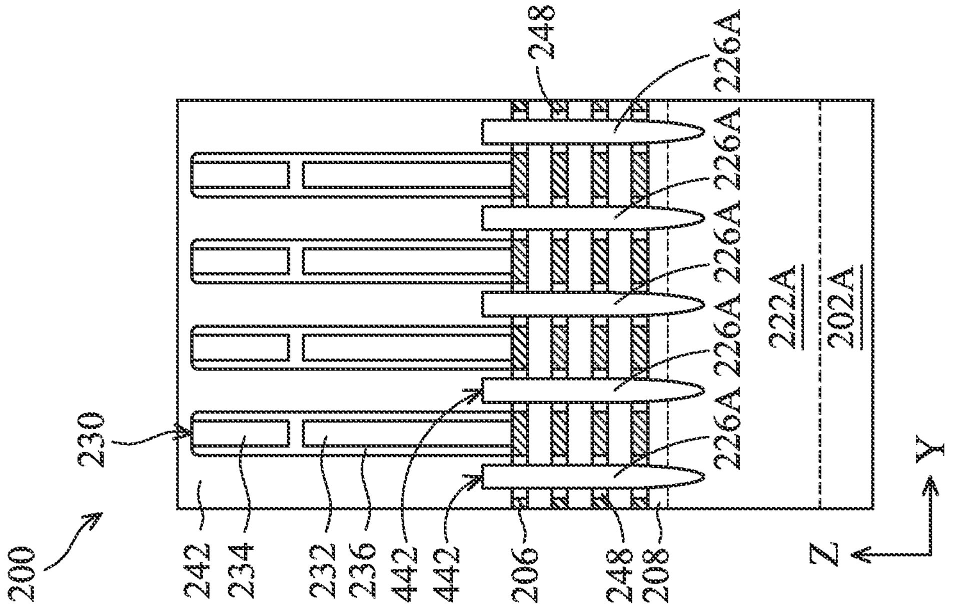

Still referring to FIGS. 10A-10D, and to block 710 of FIG. 12, metal electrode layers 221A-221D are formed over the high-k gate dielectric layer 228 and fills the remaining spaces of the gate trenches. For example, as illustrated in FIG. 10A, the metal electrode layer 221D is formed over fin structure 210A and the metal electrode layer 221B is formed over fin structure 210B-210D. The metal electrode layers 221A-221D may include any suitable materials, such as titanium nitride (TiN), tantalum nitride (TaN), titanium aluminide (TiAl), titanium aluminum nitride (TiAlN), tantalum aluminide (TaAl), tantalum aluminum nitride (TaAlN), tantalum aluminum carbide (TaAlC), tantalum carbonitride (TaCN), aluminum (Al), tungsten (W), copper (Cu), cobalt (Co), nickel (Ni), platinum (Pt), or combinations thereof. In some embodiments, the metal electrode layers 221A-221D include suitable materials to achieve desired work functions. Further, portions of the same metal electrode layers in different regions (such as an n-type doped region or a p-type doped region) may include different materials. For example, the electrode layers 221A-221D (or portions thereof) in the p-type doped regions 202A and 202B include an n-type work function metal with a work function of about 4.0 eV to about 4.6 eV; and/or the electrode layers 221A-221D (or portions thereof) in the n-type doped regions 204A and 204B include a p-type work function metal with a work function of about 4.5 eV to about 5.2 eV. In some embodiments, a CMP is performed to expose a top surface of the ILD 242. The dielectric layer 228 and the metal electrode layer 221A-221D collectively form the high-k metal gates (HKMG) 220A-220D. The HKMG 220A-220D each engage multiple channel layers, e.g. multiple layers within the stack of semiconductor layers 208 such that charge carriers may flow between the source/drain features 226A-226D through the channel layers.

As described above, at this processing stage, the fin structures 210A and 210D have a greater height than the fin structures 210B and 210C. The HKMG 220A is formed on the fin structures 210A, 210B, and 210C; the HKMG 220B is formed on the fin structures 210B, 210C, and 210D; the HKMG 220C is formed on the fin structure 210D; and the HKMG 220D is formed on the fin structure 210A. Accordingly, the HKMGs 220A-220D have a smaller thickness along the Z-direction over the fin structures 210A and 210D (or, in the p-type doped regions 202A and 202B) than over the fin structures 210B and 210C (or, in the n-type doped regions 204A and 204B).

Additional steps can be provided before, during, and after method 600, and some of the steps described can be moved, replaced, or eliminated for additional embodiments of method 600.

Therefore, FIGS. 10A-10D, in conjunction with FIG. 1C, illustrate a device prepared according to an embodiment of the method described herein. SRAM cell 200 includes multiple transistors, such as pull-up (PU) transistors, pull-down (PD) transistors, and pass-gate (PG) transistors. Pull-up transistors PU-1, PU-2 are disposed over (and electrically connected to) n-type doped regions 204A and 204B; pull-down transistor PD-1 and pass-gate transistor PG-1 are disposed over (and electrically connected to) p-type doped regions 202A and 202B; and pull-down transistor PD-2 and pass-gate transistor PG-2 are disposed over (and electrically connected to) p-type doped regions 202A and 202B. PU-1 and PU-2 are configured as p-type transistors, while PD-1, PD-2, PG-1, and PG-2 are configured as n-type transistors. Each transistor includes a fin structure disposed over the substrate 201. For example, pass-gate transistor PG-1 includes a fin structure 210A; pull-down transistor PD-1 includes a fin structure 210A; pull-up transistor PU-1 includes a fin structure 210B; pull-up transistor PU-2 includes a fin structure 210C; pull-down transistor PD-2 includes a fin structure 210D; and pass-gate transistor PG-2 includes the fin structure 210D. Each transistor also includes a gate structure. For example, pass-gate transistor PG-1 includes gate structure 220D disposed over fin structure 210A (and between epitaxial source/drain features 226A); pull-down transistor PD-1 includes gate structure 220A disposed over fin structure 210A (and between epitaxial source/drain features 226A); pull-up transistor PU-1 includes gate structure 220A disposed over fin structure 210B (and between epitaxial source/drain features 226B); pull-transistor PU-2 includes gate structure 220B disposed over fin structure 210C (and between epitaxial source/drain features 226C); pull-down transistor PD-2 includes gate structure 220B disposed over fin structure 210D (and between epitaxial source/drain features 226D); and pass-gate transistor PG-2 includes gate structure 220C disposed over fin structure 210D (and between epitaxial source/drain features 226D).

Fin structures 210A-210D each have at least one channel region, at least one source region, and at least one drain region defined along their respective lengths in the y-direction, where a channel region is disposed between the pair of source and drain regions. Each of the fin structures 210A-210D has at least one pair of epitaxial source/drain features 226A-226D in the source/drain region. Fin structures 210A-210D each include base fins 222A-222D and multiple suspended channel layers 208 (or, semiconductor layers 208) formed in the channel region over the base fins 222A-222D. The channel layers 208 each connect the respective pair of epitaxial source/drain features 226A-226D, and each engage with a gate structure, such that current can flow between the respective source/drain regions through the channel layers during operation. For example, a pair of epitaxial source/drain features 226A are disposed over base fin 222A along its length in the y-direction. Channel layers 208 are also formed over base fin 222A interposing between the pair of epitaxial source/drain features 226A, such that each channel layer connects the pair of epitaxial source/drain features 226A. The channel layers 208 each engage with a gate structure, such as gate structure 220A and/or gate structure 220D, such that current can flow between the source/drain regions through the channel layers 208 during the operation. Gate structures 220A-220D each include respective gate stacks configured to achieve desired functionality according to design requirements of SRAM cell 200, such that gate structures 220A-220D include the same or different layers and/or materials from one another.

P-type transistors PU-1 and PU-2 of SRAM cell 200 differ from n-type transistors PG-1, PG-2, PD-1, and PD-2 of SRAM cell 200 in that they include fewer channel layers, for example, one or two layers fewer, or one thirds (⅓) to two thirds (⅔) fewer. Furthermore, the epitaxial source/drain features of the p-type transistors PU-1 and PU-2 are of a size (e.g. volume) smaller than that of the n-type transistors PG-1, PG-2, PD-1, and PD-2, for example, about 10% smaller to about 50% smaller. Accordingly, a top surface of the epitaxial source/drain features of n-type transistors PG-1, PG-2, PD-1, and PD-2 extend over a top surface of the epitaxial source/drain features of p-type transistors PU-1 and PU-2.

The present disclosure provides for many different embodiments. Memory chips for asymmetric channel layer configurations, as well as methods of making the same, are disclosed herein for improving performance and processing margins. An example method includes receiving a semiconductor substrate having a first doped region of a first type dopant and a second doped region adjacent to the first doped region and of a second type dopant. The second type dopant is different than the first type dopant. The method also includes forming a stack over the first doped region and the second doped region. The stack includes first layers and second layers alternating with each other within the stack. The first layers each have a first semiconductor material and the second layers each have a second semiconductor material different than the first semiconductor material. The method further includes forming a mask element over the stack. The mask element exposes the stack in a channel region over the second doped region. Moreover, the method includes removing a top portion of the stack exposed in the channel region to form a recessed stack in the channel region over the second doped region; and processing the stack to form a first transistor and a second transistor. The first transistor has a first number of first layers over the first doped region. The second transistor has a second number of first layers over the second doped region. The first number is greater than the second number.

In some embodiments, the first type dopant is a p-type dopant and the second type dopant is an n-type dopant. In some embodiments, a ratio of the second number to the first number is about one to three (1:3) to about two to three (2:3). In some embodiments, the first semiconductor material is silicon (Si), and the second semiconductor material is silicon germanium (SiGe). Moreover, the removing of the top portion includes removing two layers of the first layers and one layer of the second layers. In some embodiments, the removing of the top portion includes removing three layers of the first layers and two layers of the second layers. In some embodiments, the removing of the top portion includes cyclically providing a first gas to remove one of the first layers and a second gas to remove one of the second layers. In some embodiments, the first semiconductor material is silicon (Si), the second semiconductor material is silicon germanium (SiGe), the first gas is selected from chlorine, hydrogen chloride, hydrogen bromide, and the second gas is selected from fluorine, hydrogen fluoride, and trifluoronitrogen. In some embodiments, the processing of the stack includes patterning the stack into a first plurality of fin structures over the first doped region and a second plurality of fin structures over the second doped region. Each of the first and second plurality of fin structures extend along a first direction. The patterning of the stack includes patterning the first layers of the stack such that the first plurality of fin structures has the first number of patterned first layers and the second plurality of fin structures has the second number of patterned first layers. The processing of the stack also includes forming dummy gates over the first plurality and the second plurality of fin structures. The dummy gates extend along a second direction substantial orthogonal to the first direction. The dummy gates overlay the recessed stack in the channel region. Moreover, the processing of the stack includes recessing the first plurality and the second plurality of fin structures adjacent to the dummy gates to expose side surfaces of patterned first layers; and growing epitaxial features on the exposed side surfaces of the patterned first layers. The epitaxial features have a first volume over the first doped region and have a second volume over the second doped region. The first volume is greater than the second volume. In some embodiments, a ratio of the first volume to the second volume is about two to one (2:1) to about ten to one (10:1). In some embodiments, the second number is less than the first number by one. In some embodiments, the second number is less than the first number by two.

An example device includes a semiconductor substrate having a first doped region of a first type dopant and a second doped region of a second type dopant. The first doped region is disposed adjacent to the second doped region. The device also includes a first transistor disposed over the first doped region and a second transistor disposed over the second doped region. The first transistor includes a first channel stack disposed between first epitaxial source/drain features. The second transistor includes a second channel stack disposed between second epitaxial source/drain features. The first channel stack includes a first number of first channel layers and the first epitaxial source/drain features each have a first volume. The second channel stack includes a second number of second channel layers and the second epitaxial source/drain features each have a second volume. The first number is greater than the second number. The first volume is greater than the second volume. And the first type dopant is different than the second type dopant.

In some embodiments, the first type dopant is a p-type dopant, the second type dopant is an n-type dopant, and the first and second channel layers are silicon (Si) channel layers. In some embodiments, a difference between the first number and the second number is one (1) or two (2). In some embodiments, the second volume is less than the first volume by about ten percent (10%) to about fifty percent (50%). In some embodiments, the first channel layers extend between the first epitaxial source/drain features along a first direction. The second channel layers extend between the second epitaxial source/drain features along the first direction. The first channel layers and the second channel layers are stacked over the semiconductor substrate along a second direction. The first channel layers each have a first lateral width along a third direction perpendicular to a plane defined by the first direction and the second direction. The second channel layers each have a second lateral width along the third direction. The first epitaxial source/drain features each have a third lateral width along the third direction. The third lateral width is a maximum lateral width of the first epitaxial source/drain features along the third direction. The third lateral width is greater than the first lateral width by a first difference. The second epitaxial source/drain features each have a fourth lateral width along the third direction. The fourth lateral width is a maximum lateral width of the second epitaxial source/drain features along the third direction. The fourth lateral width is greater than the second lateral width by a second difference. Furthermore, a ratio of the first difference to the second difference is between about one to three (1:3) to about two to three (2:3). In some embodiments, the first transistor is a pull-down (PD) transistor and the second transistor is a pull-up (PU) transistor.

Another general aspect of the present disclosure is directed to a Static Random Access Memory (SRAM) device. The SRAM device includes a semiconductor substrate; a pull-down (PU) transistor over the semiconductor substrate; and a pull-up (PU) transistor over the semiconductor substrate. The PD transistor includes a first stack having a first number of first nanosheet layers. The PU transistor includes a second stack having a second number of second nanosheet layers. The first number is an integer N; and the second number is N−2. The first stack interposes between a pair of first epitaxial source/drain features; and the second stack interposes between a pair of second epitaxial source/drain features. Moreover, each of the first epitaxial source/drain features have a first volume; each of the second epitaxial source/drain features have a second volume. The first volume is greater than the second volume.

In some embodiments, the first volume is greater than the second volume by a factor of about 11% to about 100%. In some embodiments, the first epitaxial source/drain features extend from a first height to a second height; and the second epitaxial source/drain features extend from the first height to a third height less than the second height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure comprising:

a first p-type doped region, a second p-type doped region, a first n-type doped region, and a second n-type doped region, wherein the first n-type doped region and the second n-type doped region are disposed between the first p-type doped region and the second p-type doped region;

a first semiconductor layer stack having a first number of first semiconductor layers disposed over the first p-type doped region, wherein the first semiconductor layers extend along a first lateral direction between first epitaxial source/drains;

a second semiconductor layer stack having a second number of second semiconductor layers disposed over the first n-type doped region, wherein the second semiconductor layers extend along the first lateral direction between second epitaxial source/drains;

a third semiconductor layer stack having a third number of third semiconductor layers disposed over the second n-type doped region, wherein the third semiconductor layers extend along the first lateral direction between third epitaxial source/drains;

a fourth semiconductor layer stack having a fourth number of fourth semiconductor layers disposed over the second p-type doped region, wherein the fourth semiconductor layers extend along the first lateral direction between fourth epitaxial source/drains; and wherein:

the first semiconductor layers and the fourth semiconductor layers have a first dimension along a second lateral direction that is different than the first lateral direction, the first epitaxial source/drains and the fourth epitaxial source/drains have a first source/drain dimension along the second lateral direction, and the first epitaxial source/drains and the fourth epitaxial source/drains have a first volume, the second semiconductor layers and the third semiconductor layers have a second dimension along the second lateral direction, the second epitaxial source/drains and the third epitaxial source/drains have a second source/drain dimension along the second lateral direction, and the second epitaxial source/drains and the third epitaxial source/drains have a second volume, and the first number is greater than the second number, the fourth number is the same as the first number, the third number is the same as the second number, the first dimension is about equal to the second dimension, the first source/drain dimension is greater than the second source/drain dimension, and the first volume is greater than the second volume.

2. The memory structure of claim 1, further comprising:

a first gate electrode disposed over the first semiconductor layer stack;

a second gate electrode disposed over the second semiconductor layer stack, the third semiconductor layer stack, and the fourth semiconductor layer stack; and wherein the first gate electrode and the second gate electrode extend lengthwise along the second lateral direction.

3. The memory structure of claim 1, wherein the first epitaxial source/drains and the fourth epitaxial source/drains are formed of a first semiconductor material and the second epitaxial source/drains and the third epitaxial source/drains are formed of a second semiconductor material that is different than the first semiconductor material.

4. The memory structure of claim 1, wherein a difference between the first number and the second number is one.

5. The memory structure of claim 1, wherein a difference between the first number and the second number is two.

6. The memory structure of claim 1, wherein:

a first maximum distance along the second lateral direction is between sidewalls of the first semiconductor layer stack and sidewalls of the first epitaxial source/drains;

a second maximum distance along the second lateral direction is between sidewalls of the second semiconductor layer stack and sidewalls of the second epitaxial source/drains;

the second maximum distance along the second lateral direction is between sidewalls of the third semiconductor layer stack and sidewalls of the fourth epitaxial source/drains;

the first maximum distance along the second lateral direction is between sidewalls of the fourth semiconductor layer stack and sidewalls of the fourth epitaxial source/drains; and the first maximum distance is greater than the second maximum distance.

7. The memory structure of claim 6, wherein a first ratio of the first maximum distance to the first dimension is less than a second ratio of the second maximum distance to the second dimension.

8. The memory structure of claim 7, wherein the first ratio of the first maximum distance to the first dimension is about 1:1 to about 1:2 and the second ratio of the second maximum distance to the second dimension is about 1:2.5 to about 1:4.

9. The memory structure of claim 1, wherein the first n-type doped region is directly adjacent to the first p-type doped region, the second n-type doped region is directly adjacent to the first n-type doped region, and the second p-type doped region is directly adjacent to the second n-type doped region.

10. A method comprising:

forming a semiconductor layer stack over a substrate, wherein the semiconductor layer stack includes first semiconductor layers and second semiconductor layers, a first portion of the semiconductor layer stack is over a first type doped region of the substrate, a second portion of the semiconductor layer stack is over a second type doped region of the substrate, and the first portion of the semiconductor layer stack and the second portion of the semiconductor layer stack have a first number of the first semiconductor layers;

forming a patterned mask layer over the semiconductor layer stack, wherein the patterned mask layer covers the first portion of the semiconductor layer stack and exposes the second portion of the semiconductor layer stack;

etching the exposed second portion of the semiconductor layer stack to recess the second portion of the semiconductor layer stack, wherein the recessed second portion of the semiconductor layer stack has a second number of the first semiconductor layers that is less than the first number of the first semiconductor layers;

forming a third semiconductor layer over the recessed second portion of the semiconductor layer stack; and processing the semiconductor layer stack to form a first semiconductor layer stack and a second semiconductor layer stack each having the first number of the first semiconductor layers over the first type doped region and a third semiconductor layer stack and a fourth semiconductor layer stack each having the second number of the first semiconductor layers over the second type doped region, wherein the processing includes removing the second semiconductor layers and removing the third semiconductor layer.

11. The method of claim 10, wherein a difference between the first number and the second number is one.

12. The method of claim 10, wherein a difference between the first number and the second number is two.

13. The method of claim 10, wherein the etching the exposed second portion of the semiconductor layer stack to recess the second portion of the semiconductor layer stack includes removing at least one of the first semiconductor layers and at least two of the second semiconductor layers of the exposed second portion from the semiconductor layer stack.

14. The method of claim 10, wherein the first type doped region is a p-type doped region, and the second type doped region is an n-type doped region.

15. The method of claim 10, wherein the forming the third semiconductor layer over the recessed second portion of the semiconductor layer stack includes:

selectively depositing a semiconductor material on the recessed second portion of the semiconductor layer stack; and performing a planarization process on the semiconductor material, wherein the planarization process removes the patterned mask layer.

16. The method of claim 10, wherein the forming the patterned mask layer over the semiconductor layer stack includes forming a patterned oxide layer.

17. The method of claim 10, further comprising:

forming first epitaxial source/drains, second epitaxial source/drains, third epitaxial source/drains, and fourth epitaxial source/drains; and wherein:

the first semiconductor layer stack extends along a first lateral direction between the first epitaxial source/drains, the second semiconductor layer stack extends along the first lateral direction between the second epitaxial source/drains, the third semiconductor layer stack extends along the first lateral direction between the third epitaxial source/drains, and the fourth semiconductor layer stack extends along the first lateral direction between the fourth epitaxial source/drains, the first semiconductor layers of the first semiconductor layer stack, the second semiconductor layer stack, the third semiconductor layer stack, and the fourth semiconductor layer stack have a same width along a second lateral direction that is different than the first lateral direction, the first epitaxial source/drains and the second epitaxial source/drains have a first source/drain dimension along the second lateral direction, the third epitaxial source/drains and the fourth epitaxial source/drains have a second source/drain dimension along the second lateral direction, and the first source/drain dimension is greater than the second source/drain dimension, and the first epitaxial source/drains and the second epitaxial source/drains have a first volume, the third epitaxial source/drains and the fourth epitaxial source/drains have a second volume, and the first volume is greater than the second volume.

18. A device structure comprising:

a first gate stack that surrounds a first number of first semiconductor layers, wherein the first gate stack extends lengthwise along a first direction, the first semiconductor layers extend lengthwise along a second direction between first epitaxial source/drains, and the second direction is different than the first direction;

a second gate stack that surrounds a second number of second semiconductor layers, wherein the second gate stack extends lengthwise along the first direction, the second semiconductor layers extend lengthwise along the second direction between second epitaxial source/drains, and the second number is less than the first number;

a first maximum distance along the first direction is between sidewalls of the first semiconductor layers and sidewalls of the first epitaxial source/drains; and a second maximum distance along the first direction is between sidewalls of the second semiconductor layers and sidewalls of the second epitaxial source/drains, wherein the first maximum distance is greater than the second maximum distance.

19. The device structure of claim 18, wherein:

the first semiconductor layers have a first width along the first direction;

the second semiconductor layers have a second width along the first direction; and a first ratio of the first maximum distance to the first width is less than a second ratio of the second maximum distance to the second width.

20. The device structure of claim 19, wherein the first ratio of the first maximum distance to the first width is about 1:1 to about 1:2 and the second ratio of the second maximum distance to the second width is about 1:2.5 to about 1:4.

* * * * *